United States Patent
Song et al.

(10) Patent No.: US 9,799,560 B2
(45) Date of Patent: Oct. 24, 2017

(54) SELF-ALIGNED STRUCTURE

(71) Applicant: QUALCOMM Incorporated, San Diego, CA (US)

(72) Inventors: Stanley Seungchul Song, San Diego, CA (US); Jeffrey Junhao Xu, San Diego, CA (US); Kern Rim, San Diego, CA (US); Da Yang, San Diego, CA (US); John Jianhong Zhu, San Diego, CA (US); Junjing Bao, San Diego, CA (US); Niladri Narayan Mojumder, San Diego, CA (US); Vladimir Machkaoutsan, Wezemaal (BE); Mustafa Badaroglu, Leuven (BE); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/853,670

(22) Filed: Sep. 14, 2015

(65) Prior Publication Data
US 2016/0293485 A1 Oct. 6, 2016

Related U.S. Application Data

(60) Provisional application No. 62/140,821, filed on Mar. 31, 2015.

(51) Int. Cl.
*H01L 27/088* (2006.01)
*H01L 21/768* (2006.01)
(Continued)

(52) U.S. Cl.
CPC .. *H01L 21/76897* (2013.01); *H01L 21/32139* (2013.01); *H01L 21/76895* (2013.01); *H01L 21/823418* (2013.01); *H01L 21/823431* (2013.01); *H01L 21/823475* (2013.01); *H01L 23/535* (2013.01); *H01L 27/0886* (2013.01); *H01L 29/41791* (2013.01); *H01L 29/66795* (2013.01); *H01L 29/785* (2013.01)

(58) Field of Classification Search
CPC .................. H01L 21/76897; H01L 23/535
USPC ....................................... 257/401
See application file for complete search history.

(56) References Cited

U.S. PATENT DOCUMENTS 7,462,899 B2 12/2008 Seo et al.
7,476,584 B2 1/2009 Park
(Continued)

OTHER PUBLICATIONS

Partial International Search Report for International Application No. PCT/US2016/016379, ISA/EPO, dated Apr. 29, 2016, 7 pgs.
(Continued)

*Primary Examiner* — Long K Tran
(74) *Attorney, Agent, or Firm* — Qualcomm Incorporated-Toler

(57) ABSTRACT

A fin-type semiconductor device includes a gate structure and a source/drain structure. The fin-type semiconductor device also includes a gate hardmask structure coupled to the gate structure. The gate hardmask structure comprises a first material. The fin-type semiconductor device further includes a source/drain hardmask structure coupled to the source/drain structure. The source/drain hardmask structure comprises a second material.

40 Claims, 22 Drawing Sheets

(51) Int. Cl.
  *H01L 21/3213* (2006.01)
  *H01L 21/8234* (2006.01)
  *H01L 23/535* (2006.01)
  *H01L 29/417* (2006.01)
  *H01L 29/66* (2006.01)
  *H01L 29/78* (2006.01)

(56) References Cited

U.S. PATENT DOCUMENTS

| | | |
|---|---|---|
| 8,569,152 B1 | 10/2013 | Basker et al. |
| 8,765,599 B2 | 7/2014 | Yuan et al. |
| 2004/0038508 A1 | 2/2004 | Satoh |
| 2005/0082601 A1 | 4/2005 | Chu et al. |
| 2011/0097863 A1 | 4/2011 | Shieh et al. |
| 2011/0156107 A1 | 6/2011 | Bohr et al. |
| 2011/0233679 A1* | 9/2011 | Chen ............... H01L 21/823431 257/368 |
| 2013/0065371 A1 | 3/2013 | Wei et al. |
| 2014/0038508 A1* | 2/2014 | Solazzo ................... B60H 1/26 454/147 |
| 2014/0077305 A1* | 3/2014 | Pethe ................ H01L 21/76895 257/368 |
| 2014/0264485 A1 | 9/2014 | Li et al. |
| 2014/0302678 A1 | 10/2014 | Paterson et al. |
| 2015/0014774 A1 | 1/2015 | Anderson et al. |
| 2015/0048428 A1* | 2/2015 | Cheng ................... H01L 29/665 257/288 |
| 2015/0318214 A1* | 11/2015 | Tsai ................ H01L 21/823487 257/9 |

OTHER PUBLICATIONS

International Search Report and Written Opinion—PCT/US2016/016379—ISA/EPO—Jul. 27, 2016.

\* cited by examiner

SELF-ALIGNED STRUCTURE

I. CROSS REFERENCE TO RELATED APPLICATIONS

The present application claims the benefit of U.S. Provisional Patent Application No. 62/140,821, filed Mar. 31, 2015, the content of which is expressly incorporated herein by reference in its entirety.

II. FIELD

The present disclosure is generally related to a self-aligned structure.

III. DESCRIPTION OF RELATED ART

An electronic device (e.g., a wireless phone or a computing device) may include a fin-type semiconductor device. A fin-type semiconductor device (e.g., a fin field-effect transistor (FinFET)) is a semiconductor device that includes a fin-shaped semiconductor structure associated with a conducting channel and a gate.

Scaling geometry of fin-type semiconductor layouts that include switches (e.g., transistors, such as p-type metal-oxide-semiconductor (PMOS), n-type metal-oxide-semiconductor (NMOS), or both) becomes difficult at 7 nanometers (nm) and below. For example, difficulty may arise because contacts, such as gate contacts, source/drain contacts, or both, may be misaligned during formation. If appropriate isolation space is not provided between contacts and other components, misalignment of a contact may cause a short between the contact and another component of the semiconductor device. To illustrate, a misaligned gate contact may short to source/drain routing, to an active area, or both. As another example, a misaligned source/drain contact (e.g., a drain contact) may short to a gate. To avoid shorting of contacts at scaled geometry, isolation spacing between contacts and other components may be increased. However, increasing the isolation spacing may increase a footprint (e.g. a layout area) of a semiconductor device, reduce an operating speed of the semiconductor device, and increase a cost of fabricating the semiconductor device.

IV. SUMMARY

In a particular aspect, a fin-type semiconductor device includes a gate structure and a source/drain structure. The fin-type semiconductor device also includes a gate hardmask structure coupled to the gate structure. The gate hardmask structure comprises a first material. The fin-type semiconductor device further includes a source/drain hardmask structure coupled to the source/drain structure. The source/drain hardmask structure comprises a second material.

In another particular aspect, a method of forming a fin-type semiconductor device includes forming a gate hardmask structure and forming a source/drain hardmask structure. The gate hardmask structure includes a first material having a first etch selectivity and the source/drain hardmask structure includes a second material having a second etch selectivity. The second etch selectivity is different from the first etch selectivity.

In another particular aspect, a computer-readable storage device stores instructions that, when executed by a processor, cause the processor to perform operations including initiating formation of a gate hardmask structure of a fin-type semiconductor device and initiating formation of a source/drain hardmask structure of the fin-type semiconductor device. The gate hardmask structure includes a first material having a first etch selectivity. The source/drain hardmask structure includes a second material having a second etch selectivity. The second etch selectivity is different from the first etch selectivity.

In another particular aspect, an apparatus includes first means for insulating a gate structure from a source drain structure and second means for insulating the gate structure from the source drain structure. The first means for insulating is coupled to the gate structure and is associated with a first etch selectivity. The second means for insulating is coupled to the source/drain structure and is associated with a second etch selectivity. The second etch selectivity is different from the first etch selectivity.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIGS. 1A-B illustrate block diagrams of a particular illustrative aspect of a semiconductor device that includes a self-aligned structure;

FIGS. 2A-H illustrate stages of a first process to fabricate the semiconductor device of FIG. 1A;

FIGS. 3A-J illustrate stages of a second process to fabricate the semiconductor device of FIG. 1A;

FIG. 4 is a block diagram of a particular illustrative aspect of a semiconductor device that includes a self-aligned structure;

FIGS. 5A-C illustrate stages of a first process to fabricate the semiconductor device of FIG. 4;

FIGS. 6A-B illustrate stages of a first process to fabricate the semiconductor device of FIG. 4;

FIG. 7 is a block diagram of a particular illustrative aspect of a semiconductor device that includes a self-aligned structure;

FIGS. 8A-I illustrate stages of a first process to fabricate the semiconductor device of FIG. 4;

VI. DETAILED DESCRIPTION

Figure 1A:

Particular aspects of the present disclosure are described below with reference to the drawings. In the description, common features are designated by common reference numbers.

The present disclosure describes formation and structures of a semiconductor device that includes one or more self-aligned contacts, such as a self-aligned gate contact, a self-aligned source/drain contact, or a combination thereof. To form a self-aligned contact, a gate hardmask structure may be formed over a gate structure and a source/drain hardmask structure may be formed over a source/drain structure. The gate hardmask structure may include a first material and the source/drain structure may include a second material. The first material and the second material may be different materials that have different etch properties (e.g., etch selectivity). For example, an etching process that is used to remove the first material from a wafer or device may leave the second material relatively intact, and vice versa. Thus, the first material may be used to "protect" device components while the second material is being etched away, and vice versa. In some implementations, a spacer structure may be positioned between the gate structure and the source/drain structure. For example, the spacer structure may also be positioned between the gate hardmask structure and the source/drain hardmask structure. The spacer structure may include a third material that may have the same or a different etch selectivity from the first material, the second material or both.

A first etching process may be performed to remove a portion of the gate hardmask structure to expose the gate structure. Because the first material has a different etch selectivity from the second material, the first etching process may leave the source/drain hardmask structure intact and may not expose a portion of the source/drain structure. For example, a first cavity formed by the first etching process and that is at least partially offset (e.g., misaligned) with respect to the gate structure may expose a portion of the gate structure and may not expose the source/drain structure. Accordingly, a misaligned gate via structure (e.g., a gate contact) formed in the first cavity may be isolated from the source/drain structure.

A second etching process may be performed to remove a portion of the source/drain hardmask structure, which exposes a portion of the source/drain structure. The second etching process may be a separate etching process from the first etching process. Because the second material has a different etch selectivity from the first material, the second etching process may leave any exposed gate hardmask structure intact and may not expose additional portion(s) of the gate structure. For example, a second cavity formed by the second etching process and that is at least partially offset (e.g., misaligned) with respect to the source/drain structure may expose a portion of the source/drain structure and may not expose the gate structure. Accordingly, a misaligned source/drain via structure (e.g., a source/drain contact) formed in the second cavity may be isolated from the gate structure. In some implementations, the source/drain via structure and the gate via structure may be formed concurrently (e.g., during the same deposition process). In some implementations, the order of the first etching process and the second etching process may be performed in a reverse order (e.g., the second etching process may be performed prior to the first etching process).

Because the first material and the second material have different etch selectivities, misalignment of a contact (e.g., a gate via structure or a source/drain via structure) may not create a short with another component of a semiconductor device. For example, a particular misaligned contact may be isolated from another contact or another component of the semiconductor device. Accordingly, the use of the gate hardmask and the source/drain hardmask may enable formation of self-aligned contacts (e.g., self-aligned via structures) without having to increase isolation spacing between contacts and other components of a semiconductor device. Thus, the techniques described herein enable an increased tolerance of misaligned contacts and prevent (or reduce) a likelihood of a contact shorting to another component of the semiconductor device without increasing a layout area of the semiconductor device at 7 nm and below.

Referring to FIG. 1A, a first particular illustrative aspect of a semiconductor device 100 that includes one or more self-aligned contacts is shown. For example, the semiconductor device 100 may include a self-aligned gate contact, a self-aligned source/drain contact (e.g., a drain contact), or a combination thereof. The semiconductor device 100 is shown in cross-sectional view. The semiconductor device 100 may be formed above (or on) a substrate (not shown). In some implementations, the semiconductor device 100 may be associated with 7 nm technology or below. In some implementations, the semiconductor device 100 is a fin-type semiconductor device (e.g., a FinFET).

The semiconductor device 100 may include dielectric layers 102-109 (e.g., multiple inter-layer dielectric (ILD) layers). For example, the semiconductor device 100 may include a first dielectric layer 102, a second dielectric layer 104, a third dielectric layer 106, a fourth dielectric layer 108, and a fifth dielectric layer 109. Although the semiconductor device 100 is illustrated as including five dielectric layers, in other implementations, the semiconductor device 100 may include more than or fewer than five dielectric layers. The dielectric layers 102-109 may include one or more dielectric materials. A dielectric material included in the dielectric layers 102-109 may include polyimide (PI), benzocyclobuten (BCB), polybenzoxazole (PBO), a silicone, an acrylic, an epoxy, a low-k material, other materials, or a combination thereof, as illustrative, non-limiting examples. For example, each of the dielectric layers 102-109 may include the same dielectric material. As another example, at least one dielectric layer of the dielectric layers 102-109 may include a particular dielectric material that is not included in the other dielectric layers.

The semiconductor device 100 may include gate structures (designated "G" in FIG. 1) 110-118. For example, the semiconductor device 100 may include a first gate structure 110, a second gate structure 112, a third gate structure 114, a fourth gate structure 116, and a fifth gate structure 118. Although the semiconductor device 100 is illustrated as including five gate structures, in other implementations, the semiconductor device 100 may include more than or fewer than five gate structures. One or more of the gate structures 110-118 may be coupled to and may be positioned above a corresponding channel region (not shown) of the semiconductor device 100. As used herein, "coupled to" may include, but is not limited to, "physically coupled to," "physically in contact with," or "physically connected to," in some implementations. Coupled to" may include a direct or an indirect connection. Additionally, "coupled to" may include "adjacent," "disposed on," or "above," as depicted in the orientation of FIG. 1A. "In other implementations, "coupled to" may include "electrically coupled" to or "in electrical contact with." One or more of the gate structures 110-118 may be a conductive structure. In some implementations, at least one of the gate structures 110-118 may be a dummy gate structure while the other gate structures are active gate structures.

The semiconductor device 100 may also include gate hardmask structures 120-128. For example, the semiconductor device 100 may include a first gate hardmask structure 120, a second gate hardmask structure 122, a third gate hardmask structure 124, a fourth gate hardmask structure 126, and a fifth gate hardmask structure 128. Although the semiconductor device 100 is illustrated as including five gate hardmask structures, in other implementations, the semiconductor device 100 may include more than or fewer than five gate hardmask structures. The gate hardmask structures 120-128 may be coupled to and may be positioned above the gate structures 110-118. For example, the gate structures 110-118 may be positioned between gate hardmask structures 120-128 and the corresponding channel region (not shown). The corresponding channel region (not shown) may be between the gate structures 110-118 and the substrate (not shown). Additionally or alternatively, the substrate may include or correspond to the corresponding channel region. To illustrate, the first gate hardmask structure 120 may be coupled to and may be positioned above the first gate structure 110, and the second gate hardmask structure 122 may be coupled to and may be positioned above the second gate structure 112.

The gate hardmask structures 120-128 may be positioned between the second dielectric layer 104 and the gate structures 110-118. For example, the first gate hardmask structure 120 may be positioned between the second dielectric layer 104 and the first gate structure 110. Each of the gate hardmask structures may include a first material that is associated with a first etch selectivity. For example, the first material may include oxygen doped silicon carbide (SiC:O), as an illustrative, non-limiting example. The first material may be an insulating material (e.g., a non-conductive material). The gate hardmask structures 120-128 may insulate the gate structures 110-118 from source/drain structures 130-136 of the semiconductor device 100. For example, the first gate hardmask structure 120 may include an insulating material and may insulate the first gate structure 110 from the first source/drain structure 130 by being coupled to the first gate structure 110. In some implementations, each of the gate hardmask structures 120-128 may substantially include the first material. As used herein, "substantially including" or "substantially comprising" a particular material may indicate that 100% of a structure is of the particular material or less than 100% of the structure is of the particular material, within normal fabrication, design, operation tolerances, or a combination thereof. Accordingly, a structure that substantially includes or substantially comprises a particular material may be assumed to operate and function according to characteristics of the particular material.

The semiconductor device 100 includes source/drain structures 130-136. For example, the semiconductor device 100 may include a first source/drain structure 130, a second source/drain structure 132, a third source/drain structure 134, and a fourth source/drain structure 136. Although the semiconductor device 100 is illustrated as including four source/drain structures, in other implementations, the semiconductor device 100 may include more than or fewer than four source/drain structures. One or more of the source/drain structures 130-136 may be coupled to and may be positioned above a corresponding source/drain region (not shown) of the semiconductor device 100. For example, the first source/drain structure 130 may be coupled to and may be positioned above a drain region of the semiconductor device 100. In some implementations, each of the source/drain structures 130-136 may be positioned between two of the gate structures 110-118. For example, the first source/drain structure 130 may be positioned between the first gate structure 110 and the second gate structure 112. As another example, the second source/drain structure 132 may be positioned between the second gate structure 112 and the third gate structure 114. One or more of the source/drain structures 130-136 may be a conductive structure. In some implementations, one or more of the source/drain structures 130-136 may be associated with source/drain routing, as described with reference to FIG. 1B.

The semiconductor device 100 may also include source/drain hardmask structures 140-146. For example, the semiconductor device 100 may include a first source/drain hardmask structure 140, a second source/drain hardmask structure 142, a third source/drain hardmask structure 144, and a fourth source/drain hardmask structure 146. Although the semiconductor device 100 is illustrated as including four source/drain hardmask structures, in other implementations, the semiconductor device 100 may include more than or fewer than four source/drain hardmask structures. The source/drain hardmask structures 140-146 may be coupled to and may be positioned above the source/drain structures 130-136. For example, the source/drain structures 130-136 may be positioned between source/drain hardmask structures 140-146 and the corresponding source/drain region (not shown). The corresponding source/drain region (not shown) may be located between source/drain structures 130-136 and the substrate (not shown). Additionally or alternatively, the substrate may include or correspond to the corresponding source/drain region. To illustrate, the first source/drain hardmask structure 140 may be coupled to and may be positioned above the first source/drain structure 130 and the second source/drain hardmask structure 142 may be coupled to and may be positioned above the second source/drain structure 132.

The source/drain hardmask structures 140-146 may be positioned between the second dielectric layer 104 and the source/drain structures 130-136. For example, the first source/drain hardmask structure 140 may be positioned between the second dielectric layer 104 and the first source/drain structure 130. Each of the source/drain hardmask structures 140-146 may include a second material that is associated with a second etch selectivity. For example, the second material may include silicon nitride (SiN), as an illustrative, non-limiting example. The second etch selectivity may be different from the first etch selectivity. The second material may be an insulating material (e.g., a non-conductive material). The source/drain hardmask structures 140-146 may insulate the gate structures 110-118 from the source/drain structures 130-136. For example, the first source/drain hardmask structure 140 may include an insulating material and may insulate the first gate structure 110 from the first source/drain structure 130 by being coupled to the first source/drain structure 130.

One or more of the hardmask structures (e.g., the gate hardmask structures or the source/drain hardmask structures) may be confined to their corresponding structure (e.g., a particular gate or a particular source/drain). For example, each of the gate hardmask structures 120-128 may be confined to its corresponding gate. To illustrate, an entirety of a bottom surface of the first gate hardmask structure 120 may be in contact with a portion of the first gate structure 110. An air gap, a spacer structure, or a combination thereof, may be positioned between the first gate hardmask structure 120 and the source/drain structures 130-136 and may be positioned between the first gate hardmask structure 120 and the source/drain hardmask structures 140-146. The first gate hardmask structure 120 may not be in contact with the source/drain structures 130-136 or with the source/drain hardmask structures 140-146. As another example, each of the source/drain hardmask structures 140-146 may be confined to its corresponding source/drain. To illustrate, an entirety of a bottom surface of the first source/drain hardmask structure 140 may be in contact with a portion of the first source/drain structure 130. An air gap, a spacer structure, or a combination thereof, may be positioned between the first source/drain hardmask structure 140 and the gate structures 110-118 and may be positioned between the first source/drain hardmask structure 140 and the gate hardmask structures 120-128. The first source/drain hardmask structure 140 may not be in contact with the gate structures 110-118 or with the gate hardmask structures 120-128.

The semiconductor device 100 may include spacer structures 150-159. For example, the semiconductor device 100 may include a first spacer structure 150, a second spacer structure 151, a third spacer structure 152, a fourth spacer structure 153, a fifth spacer structure 154, a sixth spacer structure 155, a seventh spacer structure 156, an eighth spacer structure 157, a ninth spacer structure 158, and a tenth spacer structure 159. Although the semiconductor device 100 is illustrated as including ten spacer structures, in other implementations, the semiconductor device 100 may include more than or fewer than ten spacer structures. Each of the spacer structures 150-159 may include a third material that is associated with a third etch selectivity. For example, the third material may include silicon dioxide ($SiO_2$), as an illustrative, non-limiting example. The third etch selectivity may be different from the first etch selectivity and the second etch selectivity. The third material may be an insulating material (e.g., a non-conductive material).

At least one of the spacer structures 150-159 may be positioned between a particular gate structure and a particular source/drain structure. For example, the second spacer structure 151 may be positioned between the first gate structure 110 and the first source/drain structure 130. As another example, the third spacer structure 152 may be positioned between the first source/drain structure 130 and the second gate structure 112. As another example, the fifth spacer structure 154 may be positioned between the second source/drain structure 132 and the third gate structure 114.

Additionally or alternatively, at least one of the spacer structures 150-159 may be positioned between a particular gate hardmask structure and a particular source/drain hardmask structure. For example, the second spacer structure 151 may be positioned between the first gate hardmask structure 120 and the first source/drain hardmask structure 140. As another example, the sixth spacer structure 155 may be positioned between the second source/drain hardmask structure 142 and the third gate hardmask structure 124 and the third source/drain hardmask structure 144.

The semiconductor device 100 may include multiple via structures. For example, the semiconductor device 100 may include a first via structure 160 (e.g., a source/drain via structure), a second via structure 162 (e.g., a gate via structure), a third via structure 172, and a fourth via structure 174. In some implementations, each of the multiple via structures may include or correspond to a contact, such as a gate contact or a source/drain contact. In some implementations, the first via structure 160 and the second via structure 162 may be associated with a via 1 (V1) layer of the semiconductor device 100. Additionally, the third via structure 172 and the fourth via structure 174 may be associated with a via 0 (V0) layer of the semiconductor device 100. Although the semiconductor device 100 is illustrated as including four via structures, in other implementations, the semiconductor device 100 may include more than or fewer than four via structures. Additionally, the semiconductor device 100 may include multiple metal lines. For example, the semiconductor device 100 may include a first metal line 170, a second metal line 180, and a third metal line 182. Although the semiconductor device 100 is illustrated as including three metal lines, in other implementations, the semiconductor device 100 may include more than or fewer than three metal lines. In some implementations, the first metal line 170 may be associated with a metal 0 (M0) layer of the semiconductor device 100, and the second metal line 180 and the third metal line 182 may be associated with a metal 1 (M1) layer of the semiconductor device 100.

The first via structure 160 may be coupled (e.g., electrically coupled) to the first source/drain structure 130 and to the first metal line 170. In some implementations, the first via structure 160 may include or correspond to a contact (e.g., a source/drain contact, such as a drain contact) of the first source/drain structure 130 to which the first via structure 160 is coupled. The second via structure 162 may be coupled (e.g., electrically coupled) to the third gate structure 114 and to the first metal line 170. In some implementations, the second via structure 162 may include or correspond to a contact (e.g., a gate contact) of the third gate structure 114 to which the second via structure 162 is coupled. The third via structure 172 may be coupled to the first metal line 170 and to the second metal line 180. The fourth via structure 174 may be coupled (e.g., electrically coupled) to the fifth gate structure 118 and to the third metal line 182.

Each of first via structure 160, the second via structure 162, and the fourth via structure 174 may be associated with a self-aligned structure. For example, the first via structure 160 may be associated with a self-aligned contact that is coupled to the first source/drain structure 130. As another example, the second via structure 162 may be associated with a self-aligned contact that is coupled to the third gate structure 114. As another example, the fourth via structure 174 may be associated with a self-aligned contact that is coupled to the fifth gate structure 118.

During manufacture of the semiconductor device 100, forming the first via structure 160 may include performing a first etching process to remove a portion of the first source/drain hardmask structure 140. The first etching process may be configured to remove the second material (having the second etch selectivity) but may not remove the first material (having the first etch electivity) or the third material (having the third etch selectivity). Forming the second via structure 162 may include a second etching process to remove a portion of the third gate hardmask structure 124. The second etching process may be configured to remove the first material (having the first etch selectivity) but may not remove the second material (having the second etch electivity) or the third material (having the third etch selectivity). Forming the fourth via structure 174 may include a third etching process to remove a portion of the fifth gate hardmask structure 128. The third etching process may be configured to remove the first material (having the first etch selectivity) but may not remove the second material (having the second etch electivity) or the third material (having the third etch selectivity). Accordingly, the use of different materials that have different etch selectivity, may prevent (or reduce) the likelihood of structures being shorted together if misalignment occurs.

FIG. 1A illustrates examples of how the likelihood of shorts due to misalignment may be prevented (or reduced) by using materials having different etch selectivity. For example, the first via structure 160 of the semiconductor device 100 is illustrated as being misaligned (e.g., offset to the right as depicted in FIG. 1A) with respect to the first source/drain structure 130. For example, a portion of the first via structure 160 may be coupled to and may be positioned above the third spacer structure 152. Additionally, another portion of the first via structure 160 may be coupled to and may be positioned above the second gate hardmask structure 122 (e.g., above the second gate structure 112). The first via structure 160 may be between the first metal line 170 and the first source/drain structure 130, the third spacer structure 152, the second gate hardmask structure 122, or a combination thereof. Despite being proximate to (e.g., positioned above as depicted in FIG. 1A) the second gate structure 112, the first via structure 160 is electrically isolated from the second gate structure 112 by the third spacer structure 152 and the second gate hardmask structure 122, which are not removed when etching the first source/drain hardmask structure 140 to expose the first source/drain structure 130. Although the first via structure 160 is illustrated as being misaligned (e.g., offset) to the right, in other implementations the first via structure 160 may be misaligned (e.g., offset) to the left with respect to the first source/drain structure 130, or may be properly aligned with the first source/drain structure 130.

As another example, the second via structure 162 of the semiconductor device 100 is illustrated as being misaligned (e.g., offset to the left as depicted in FIG. 1A) with respect to the third gate structure 114. For example, a portion of the second via structure 162 is illustrated as being positioned above the fifth spacer structure 154. Additionally, another portion of the second via structure 162 is illustrated as being positioned above the second source/drain hardmask structure 142. The second via structure 162 may be between the first metal line 170 and the third gate structure 114, the fifth spacer structure 154, the second source/drain hardmask structure 142, or a combination thereof. Despite being proximate to (e.g., positioned above as depicted in FIG. 1A) the second source/drain structure 132, the second via structure 162 is electrically isolated from the second source/drain structure 132 by the fifth spacer structure 154 and the second source/drain hardmask structure 142, which are not removed when etching the third gate hardmask structure 124 to expose the third gate structure 114. Although the second via structure 162 is illustrated as being misaligned (e.g., offset) to the left, in other implementations the second via structure 162 may be misaligned (e.g., offset) to the right with respect to the third gate structure 114, or may be properly aligned with the third gate structure 114.

The fourth via structure 174 of the semiconductor device 100 is illustrated as being misaligned (e.g., offset to the left as depicted in FIG. 1A) with respect to the fifth gate structure 118. For example, a portion of the fourth via structure 174 is illustrated as being positioned above the ninth spacer structure 158. Additionally, another portion of the fourth via structure 174 is illustrated as being positioned above the fourth source/drain hardmask structure 146. The fourth via structure 174 may be between the third metal line 182 and the fifth gate structure 118, the ninth spacer structure 158, the fourth source/drain hardmask structure 146, or a combination thereof. Despite being proximate to (e.g., positioned above as depicted in FIG. 1A) the fourth source/drain structure 136, the fourth via structure 174 is electrically isolated from the fourth source/drain structure 136 by the ninth spacer structure 158 and the fourth source/drain hardmask structure 146, which are not removed when etching the fifth gate hardmask structure 128 to expose the fifth gate structure 118. Although the fourth via structure 174 is illustrated as being misaligned (e.g., offset) to the left, in other implementations the fourth via structure 174 may be misaligned (e.g., offset) to the right with respect to the fifth gate structure 118, or may be properly aligned with the fifth gate structure 118.

During operation of the semiconductor device 100, one or more electrical charges (e.g., charges provided in response to an alternating current (AC) voltage or a direct current (DC) voltage from a signal/power source) may be applied to the semiconductor device 100 via the second metal line 180, the third metal line 184, or both. For example, a first charge applied to the second metal line 180 may be applied to the first source/drain structure 130 and to the third gate structure 114. As another example, a second charge applied to the third metal line 184 may be applied to the fifth gate structure 118.

In some implementations, one or more of the spacer structures 150-159 may define gaps, such as air gaps. For example, the spacer structures 150-159 may be spacer capping structures, as described further with reference to FIGS. 4 and 9. In some implementations, the gate hardmask structures 120-128, the source/drain hardmask structures 140-146, or a combination thereof, may be bi-layer structures, as described with reference to FIGS. 7 and 9. In other implementations, the semiconductor device 100 may not include spacer structures.

One or more via structures included in the semiconductor device may be associated with a self-aligned contact. A self-aligned via structure (e.g., self-aligned contact) may be electrically isolated (e.g., may not create a short) from another component of a semiconductor device 100 if misaligned. For example, if the self-aligned via structure is associated with a source/drain contact to be coupled to a source/drain structure, the self-aligned via structure may be electrically isolated from an adjacent component, such as a gate structure, by a spacer structure, a gate hardmask structure, or a combination thereof, that has a different etch selectivity from a source/drain hardmask structure that is etched to expose the source/drain structure.

In a particular implementation, the semiconductor device 100 is a fin-type semiconductor device including a gate structure and a source/drain structure. The fin-type semiconductor device may also include a gate hardmask structure coupled to the gate structure, the gate hardmask structure comprising a first material and a source/drain hardmask structure coupled to the source/drain structure, the source/drain hardmask structure comprising a second material.

Figure 1B:
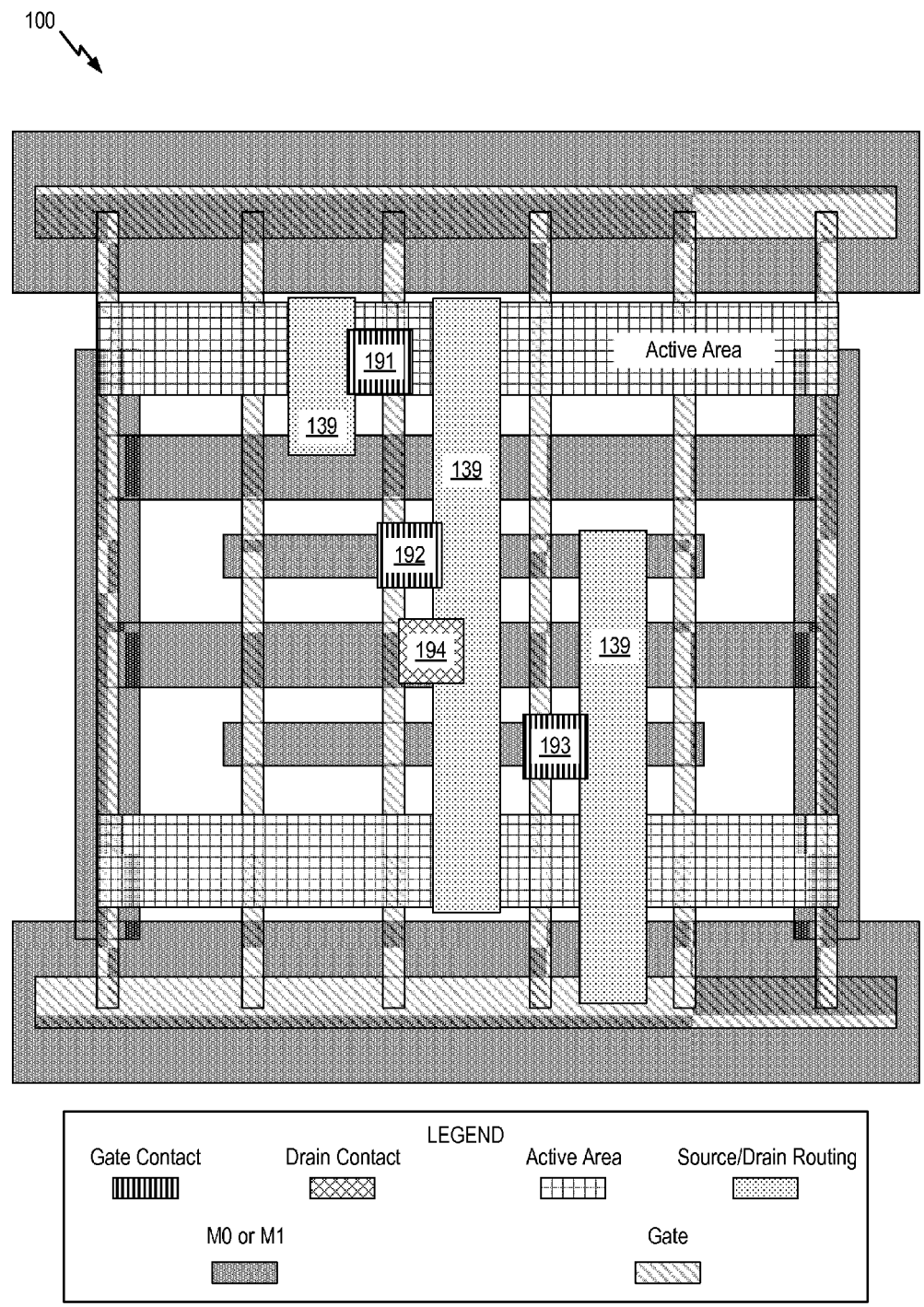

FIG. 1B shows an illustrative example of a layout of semiconductor device 100 having "misaligned" structures. The semiconductor device 100 may include multiple self-aligned contacts and multiple hardmask structures with different etch selectivities. For example, the semiconductor device 100 may include multiple self-aligned gate contacts 191, 192, and 193 (e.g., gate vias) and may include a self-aligned source/drain contact 194 (e.g., a source/drain via). In the orientation illustrated in FIG. 1B, a first gate contact 191 is illustrated as being over an active area and as being misaligned (e.g., offset to the left as depicted in FIG. 1B) over the source/drain routing 139. In the orientation illustrated in FIG. 1B, a second gate contact 192 is illustrated as being misaligned (e.g., offset to the right as depicted in FIG. 1B) over the source/drain routing 139. In the orientation illustrated in FIG. 1B, a third gate contact 193 is illustrated as being misaligned (e.g., offset to the right as depicted in FIG. 1B) over the source/drain routing 139. In the orientation illustrated in FIG. 1B, the source/drain contact 194 (e.g., a drain contact) is illustrated as being misaligned (e.g., offset to the left as depicted in FIG. 1B) over a gate and near the second gate contact 192 of the semiconductor device 100.

Each of the gate contacts 191, 192, and 193 may be electrically isolated from an adjacent component (e.g., a source/drain structure) by a spacer structure, a source/drain hardmask structure, or a combination thereof, the adjacent component having a different etch selectivity from a corresponding gate hardmask structure that is etched to expose the gate contacts. Each corresponding gate hardmask structure may include the first material that is associated with the first etch selectivity. Despite the gate contacts being located over the active area or being misaligned over the source/drain routing 139, the gate contacts are electrically isolated by corresponding gate hardmask structures. For example, the corresponding gate hardmask structure of the first gate contact 191 may be positioned between the first gate contact 191 and the source/drain routing 139, the active area or both, thereby insulating the first gate contact 191 from contact (or electrically coupling) with the source/drain routing 139, the active area, or both. Insulating the first gate contact 191 from the source/drain routing 139, the active area, or both, may prevent (or reduce) the likelihood of a short between the misaligned first gate contact 191 and the source/drain routing 139, the active area, or both.

The source/drain contact 194 (e.g., a drain contact) may be electrically isolated from an adjacent component, such as a gate structure, by a spacer structure, a gate hardmask structure, or a combination thereof, the adjacent component having a different etch selectivity from a source/drain hardmask structure that is etched to expose the source/drain contact 194. The source/drain hardmask structure may include the second material that is associated with the second etch selectivity. Despite the source/drain contact 194 (e.g., the drain contact) being misaligned over the gate and being proximate to (e.g., near) gate contacts (e.g., the second gate contact 192) the source/drain contact 194 (e.g., the drain contact) is electrically isolated by the source/drain hardmask structure. For example, the corresponding source/drain hardmask structure of the source/drain contact 194 may be positioned between the source/drain contact 194 and the gate, thereby insulating the source/drain contact 194 from contact (or electrically coupling) with the gate. Insulating the source/drain contact 194 from the gate, may prevent (or reduce) the likelihood of a short between the misaligned source/drain contact 194 and the gate. Therefore, the use of self-aligned structures (e.g., gate contacts 191, 192, and 193 and source/drain contact 194) may be used to prevent (or reduce) the likelihood of a short caused by congestion and misalignment without the need for increasing isolation spacing and the layout area of the semiconductor.

FIGS. 2A-H illustrate examples of stages of a first fabrication process that may be used to fabricate a semiconductor device. The stages of the first fabrication process are shown as cross-sectional views of formation of the semiconductor device. The semiconductor device may include the semiconductor device 100 of FIG. 1A. The semiconductor device is a fin-type semiconductor device and may include one or more self-aligned structures, such as a self-aligned via structure, a self-aligned contact, or both. The self-aligned via structure may include the first via structure 160, the second via structure 162, or the fourth via structure 174 of FIG. 1A.

Figure 2A:
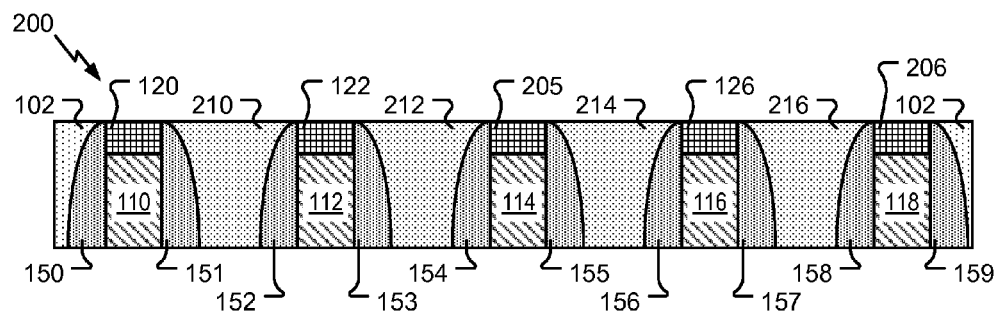

Referring to FIG. 2A, a first stage of the first fabrication process is depicted and generally designated 200. FIG. 2A shows the first dielectric layer 102 in which the gate structures 110-118 and the spacer structures 150-159 are formed. Gate hardmask structures 120, 122, 126, 205, 206 are coupled to and positioned above the gate structures 110-118. Each of the gate hardmask structures 120, 122, 126, 205, 206 may include a first material having a first etch selectivity, as described with reference to FIG. 1A. Source/drain structures 210-216 are positioned between the gate structures 110-118. Formation of the source/drain structures 210-216 may be associated with a self-aligned process based on the spacer structures 150-159.

Figure 2B:
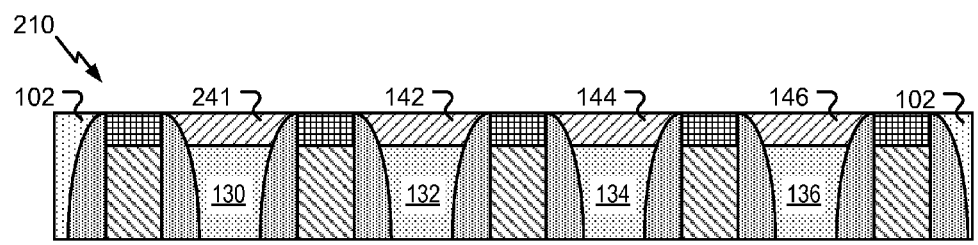

Referring to FIG. 2B, a second stage of the first fabrication process is depicted and generally designated 210. In FIG. 2B, a portion of each of the source/drain structures 210-216 has been etched (e.g., removed using a plasma etch, a dry etch, etc.) to form the source/drain structures 130-136 and the source/drain hardmask structures 142-146 and 241 have been formed. Each of the source/drain hardmask structures 142-146 and 241 may include a second material having a second etch selectivity, as described with reference to FIG. 1A. The source/drain hardmask structures 142-146 and 241 may be deposited using a deposition technique, such as a chemical vapor deposition (CVD) process, an atomic layer deposition (ALD) process, etc., followed by a planarization process, such as a chemical mechanical planarization (CMP) process. The source/drain hardmask structures 142-146 and 241 may be confined to a particular corresponding source/drain structure of the source/drain structures 130-136 when the deposition technique is followed by the planarization process.

Figure 2C:
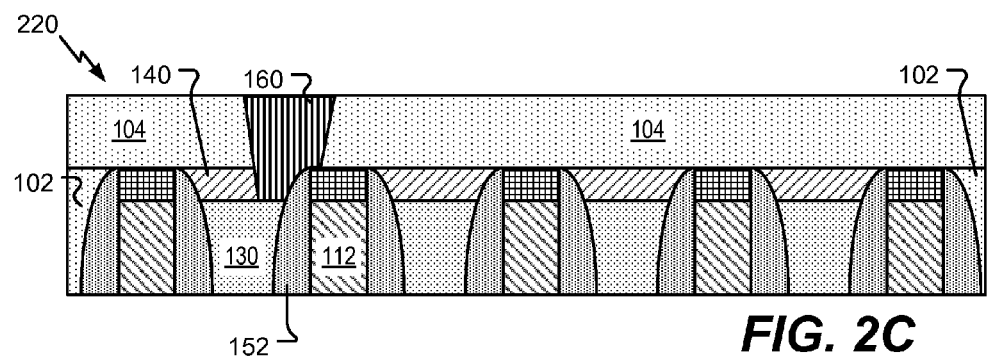

Referring to FIG. 2C, a third stage of the first fabrication process is depicted and generally designated 220. FIG. 2C shows the semiconductor device after formation of the second dielectric layer 104 and formation of the first via structure 160. In some implementations, an etch stop layer (not shown) may be deposited before the second dielectric layer 104 is formed. Formation of the first via structure 160 may include performing a first etching process that is selective to remove the second material (of the source/drain hardmask structure 241) but not the first material (of the gate hardmask structures 120, 122, 126, 205, 206) or the third material (of the spacer structures 150-159). The first etching process may result in forming the first source/drain hardmask structure 140 by removing a portion of the source/drain hardmask structure 241 of FIG. 2B. After the first etching process is performed, a conductive material (e.g., a metal, such as copper) may be deposited and a planarization process may be performed to form the first via structure 160.

Figure 2D:
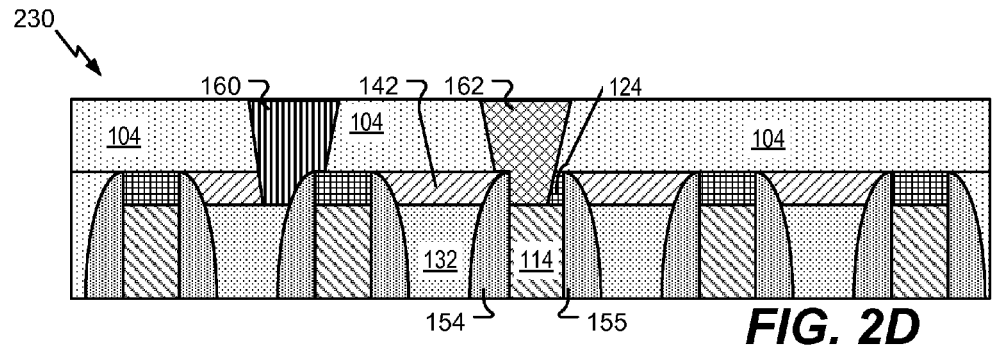

Referring to FIG. 2D, a fourth stage of the first fabrication process is depicted and generally designated 230. FIG. 2D shows the semiconductor device after formation of the second via structure 162. Formation of the second via structure 162 may include performing a second etching process that is selective to remove the first material but not the second material or the third material. The second etching process may result in forming the third gate hardmask structure 124 by removing a portion of the gate hardmask structure 205 of FIG. 2A. After the second etching process is performed, a conductive material may be deposited and a planarization process may be performed to form the second via structure 162.

Figure 2E:
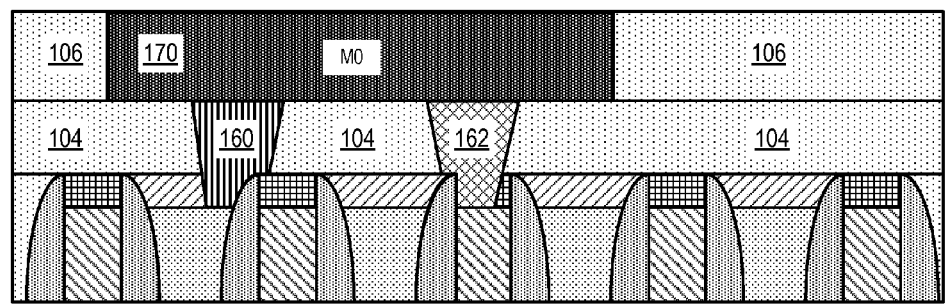

Referring to FIG. 2E, a fifth stage of the first fabrication process is depicted and generally designated 240. FIG. 2E shows the semiconductor device after formation of the third dielectric layer 106 and the first metal line 170.

Figure 2F:
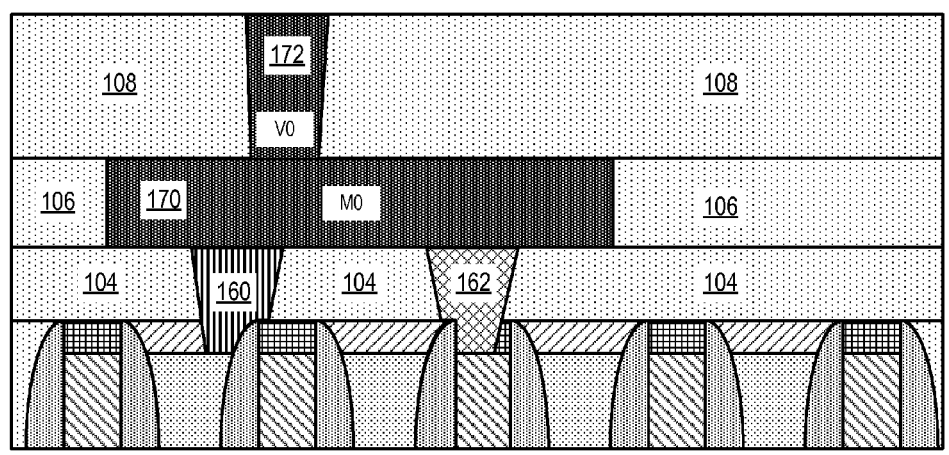

Referring to FIG. 2F, a sixth stage of the first fabrication process is depicted and generally designated 250. FIG. 2F shows the semiconductor device after formation of the fourth dielectric layer 108 and the third via structure 172.

Figure 2G:
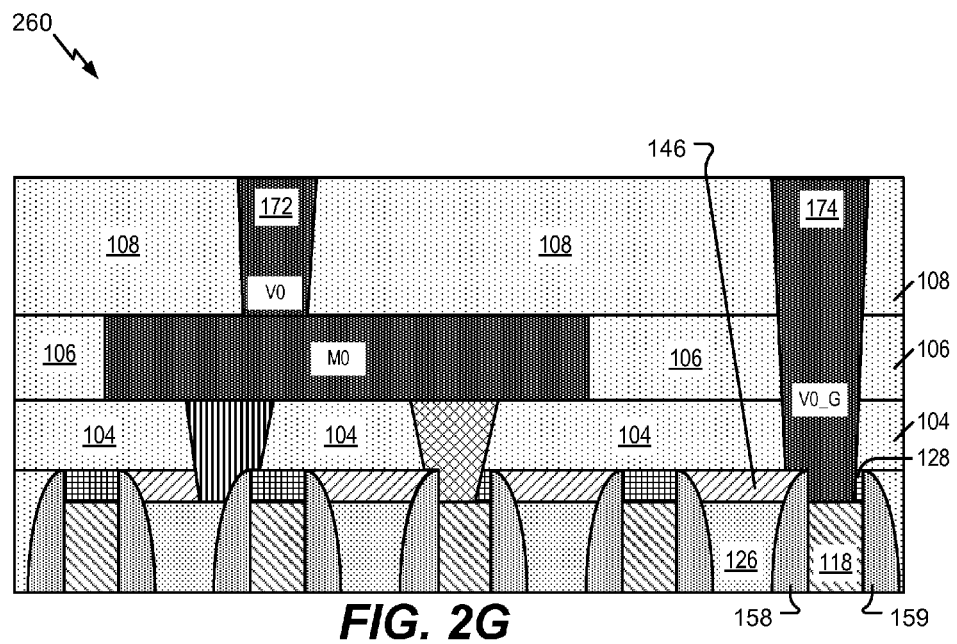

Referring to FIG. 2G, a seventh stage of the first fabrication process is depicted and generally designated 260. FIG. 2G shows the semiconductor device after formation of the fourth via structure 174. Formation of the fourth via structure 174 may include performing a third etching process that is selective to remove the first material but not the second material or the third material. The third etching process may result in forming the fifth gate hardmask structure 128 by removing a portion of the gate hardmask structure 206 of FIG. 2A. After the third etching process is performed, a conductive material may be deposited and a planarization process may be performed to form the fourth via structure 174. In some implementations the third via structure 172 and the fourth via structure 174 may be formed concurrently. For example, a conductive material may be deposited and the planarization process may form both the third via structure 172 and the fourth via structure 174.

Figure 2H:
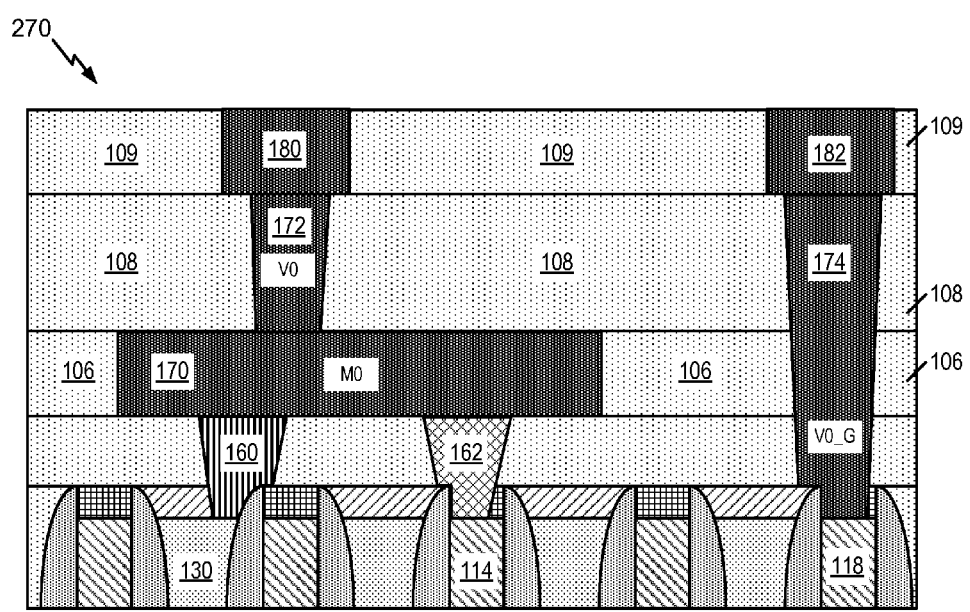

Referring to FIG. 2H, an eighth stage of the first fabrication process is depicted and generally designated 270. FIG. 2H shows the semiconductor device after formation of the fifth dielectric layer 109, the second metal line 180, and the third metal line 182.

FIGS. 3A-J illustrate examples of stages of a second fabrication process that may be used to fabricate a semiconductor device. The stages of the second fabrication process are shown as cross-sectional isometric views of formation of the semiconductor device. The semiconductor device may include the semiconductor device 100 of FIG. 1A. The semiconductor device may be a fin-type semiconductor device and may include one or more self-aligned structures, such as a self-aligned via structure, a self-aligned contact, or a combination thereof. The self-aligned via structure may include the first via structure 160, the second via structure 162, or the fourth via structure 174 of FIG. 1A.

Figure 3A:
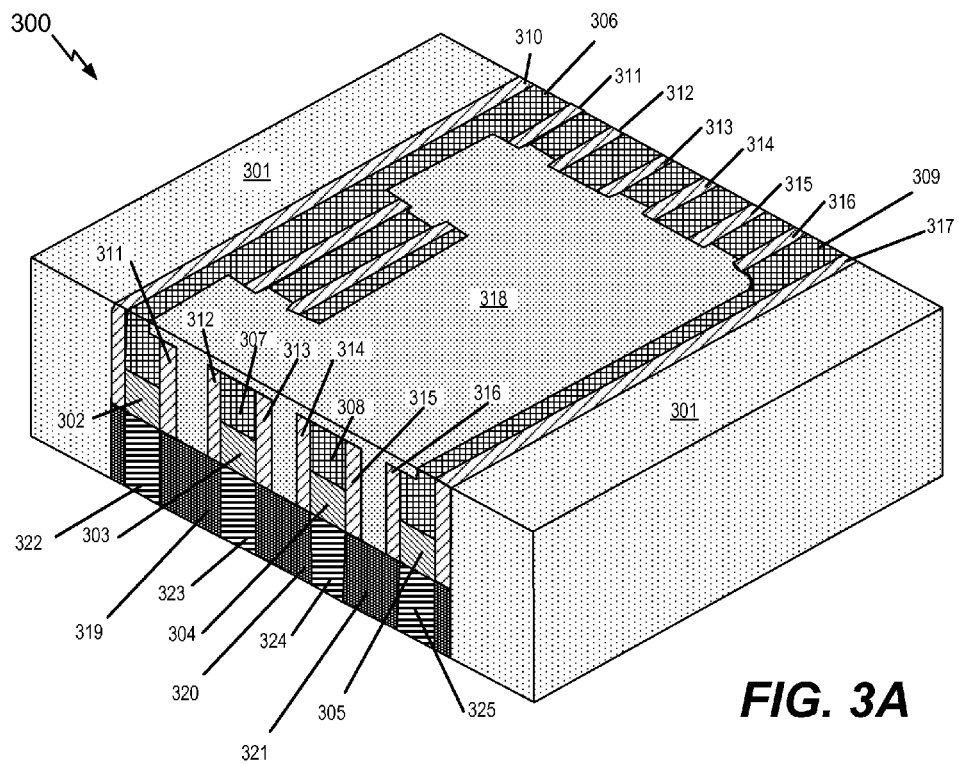

Referring to FIG. 3A, a first stage of the second fabrication process is depicted and generally designated 300. FIG. 3A shows a first dielectric layer 301 in which gate structures 302-305 and spacer structures 310-317 are formed. FIG. 3A shows formation of a semiconductor device after a conductive material associated with one or more source/drain structures has been deposited and a planarization process has been performed.

The gate structures 302-305 may include a first gate structure 302, a second gate structure 303, a third gate structure 304, and a fourth gate structure 305. In some implementations, the first gate structure 302 and the fourth gate structure 305 may be dummy gate structures. The gate structures 302-305 may include one or more of the gate structures 110-118 of FIG. 1A. The gate structures 302-305 may be coupled to and may be positioned above channel regions 322-325. Source/drain regions 319-321 may be positioned in between the channel regions 322-325. The source/drain regions 319-321 may also be positioned in between the gate structures 302-305 and the substrate (not shown). The channel regions 322-325 may be fin shaped and may be associated with a "fin" of a fin-type semiconductor (e.g., a FinFET). The channel regions 322-325 may be positioned between the gate structures 302-305 and the substrate (not shown). The channel regions 322-325, such as a fin shaped channel region, may protrude towards the gate structures 302-305 from the substrate (not shown). Additionally or alternatively, the substrate may include or correspond to the channel regions 322-325, the source/drain regions 319-321, or a combination thereof. Gate hardmask structures 306-309 may be formed on the gate structures 302-305. The gate hardmask structures 306-309 may include a first material having a first etch selectivity, as described with reference to FIG. 1A. The spacer structures 310-317 may be sacrificial spacer structures (e.g., dummy spacers).

Figure 3B:
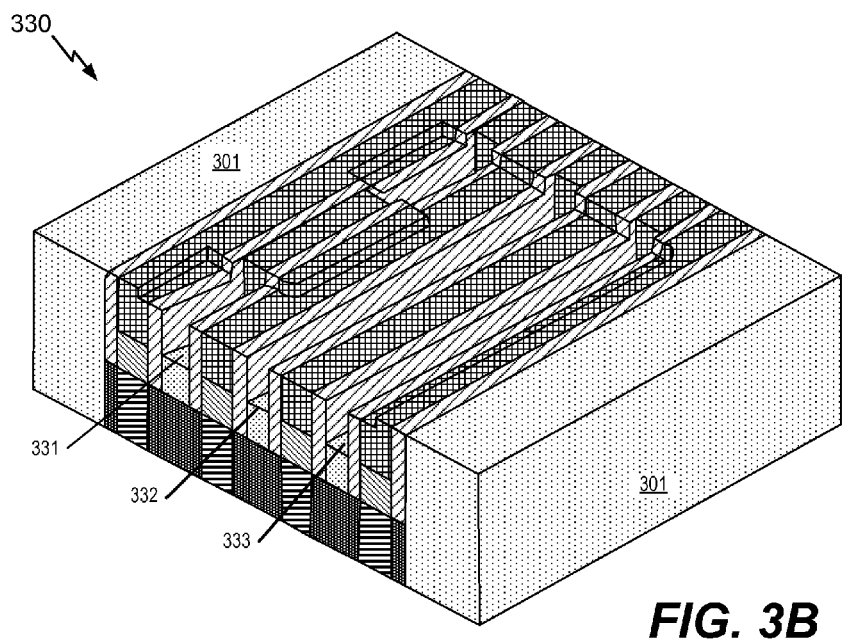

Referring to FIG. 3B, a second stage of the second fabrication process is depicted and generally designated 330. In FIG. 3B, a portion of the conductive material has been removed to form source/drain structures 331-333. The source/drain structures 331-333 may include at least one of the source/drain structures 130-136 of FIG. 1A.

Figure 3C:
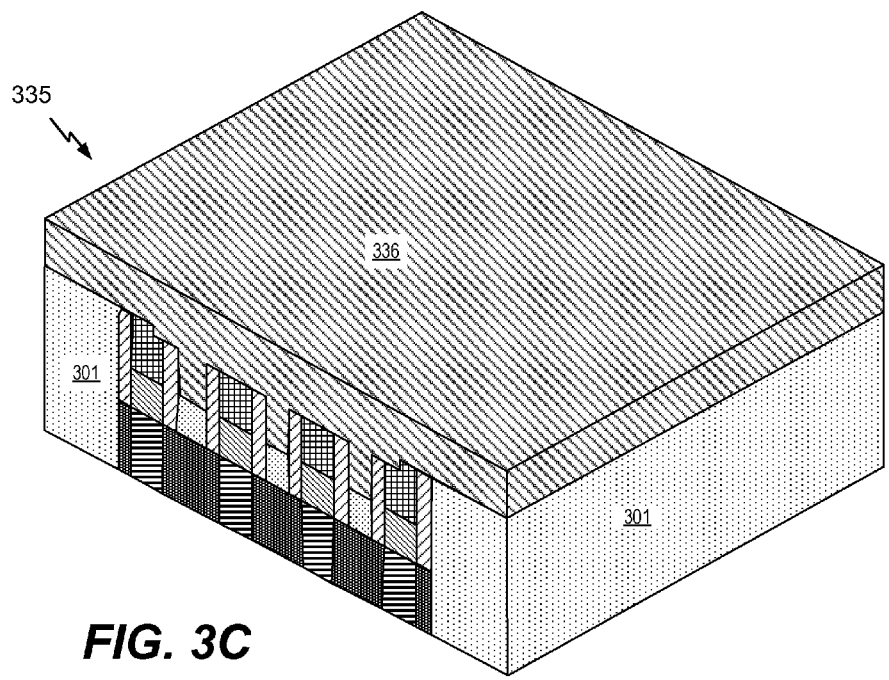

Referring to FIG. 3C, a third stage of the second fabrication process is depicted and generally designated 335. In FIG. 3C, a second material 336 has been deposited. The second material 336 may correspond to the second material having the second etch selectivity, as described with reference to FIG. 1A.

Figure 3D:
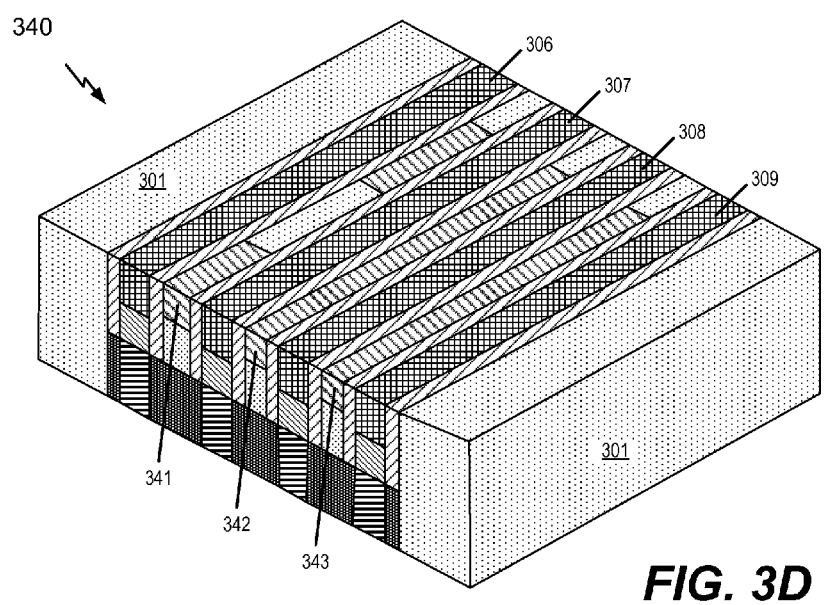

Referring to FIG. 3D, a fourth stage of the second fabrication process is depicted and generally designated 340. In FIG. 3D, a planarization process has been performed to form source/drain hardmask structures 341-343. The source/drain hardmask structures 341-343 may include one or more of the source/drain hardmask structures 140-146 of FIG. 1A.

Figure 3E:
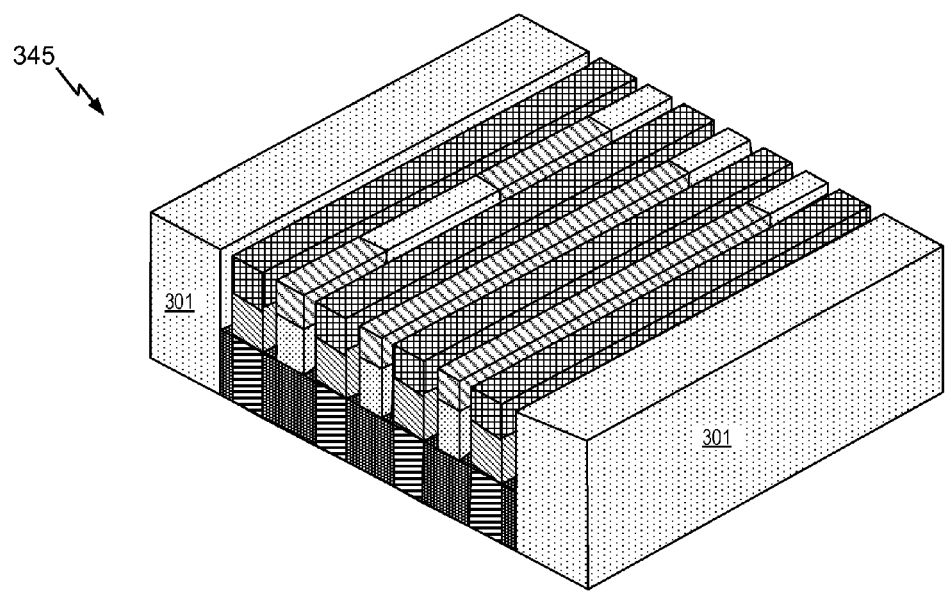

Referring to FIG. 3E, a fifth stage of the second fabrication process is depicted and generally designated 345. In FIG. 3E, the spacer structures 310-317 have been removed. For example, an etching process, such as a plasma etching process, a dry etching process, a wet etching process, etc., may be been performed to remove the spacer structures 310-317.

Figure 3F:
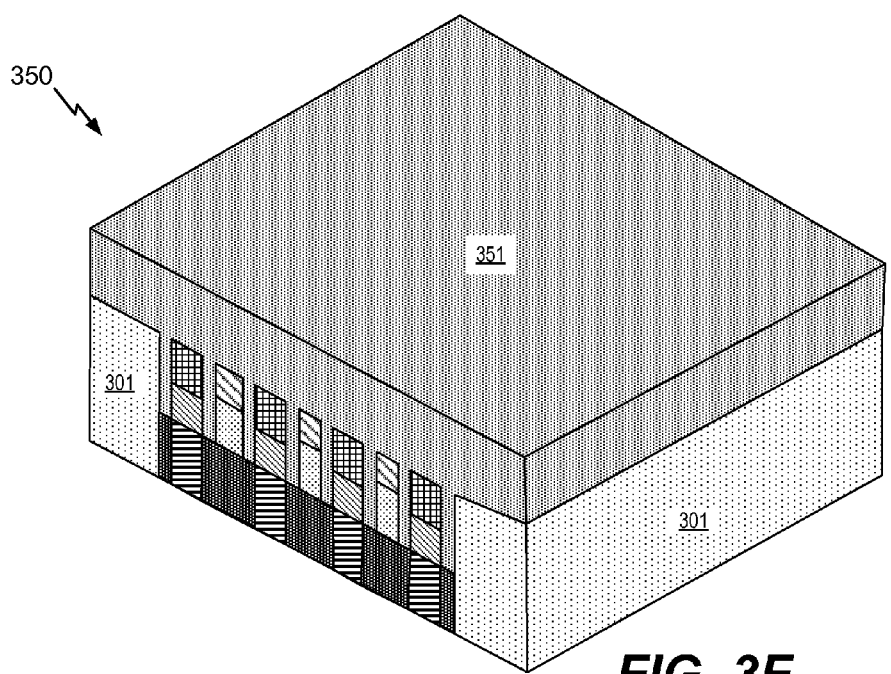

Referring to FIG. 3F, a sixth stage of the second fabrication process is depicted and generally designated 350. In FIG. 3F, a third material 351 has been deposited. The third material 351 may correspond to the third material having the third etch selectivity, as described with reference to FIG. 1A. In some implementations, the third material 351 may include a low-k dielectric material.

Figure 3G:
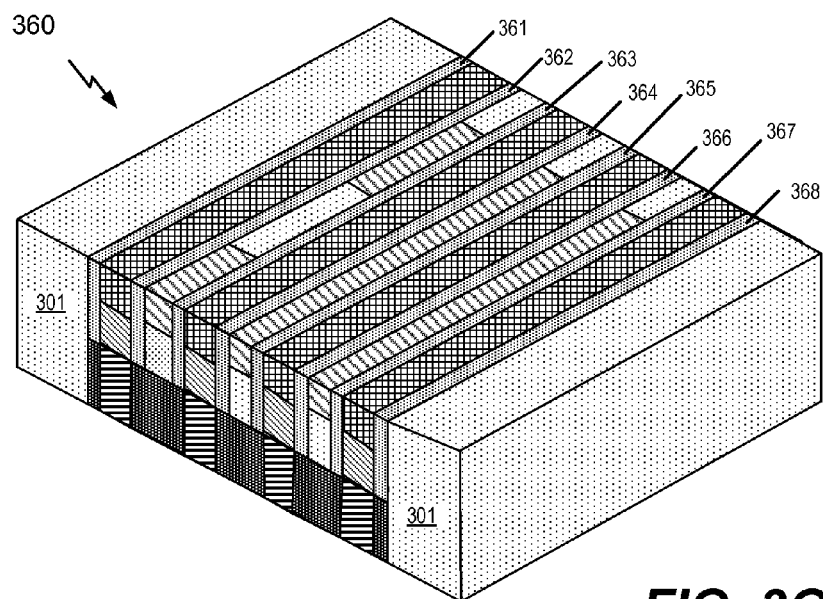

Referring to FIG. 3G, a seventh stage of the second fabrication process is depicted and generally designated 360. In FIG. 3G, a planarization process has been performed to form spacer structures 361-368. The spacer structures 361-368 may include one or more of the spacer structures 150-159 of FIG. 1A.

Figure 3H:
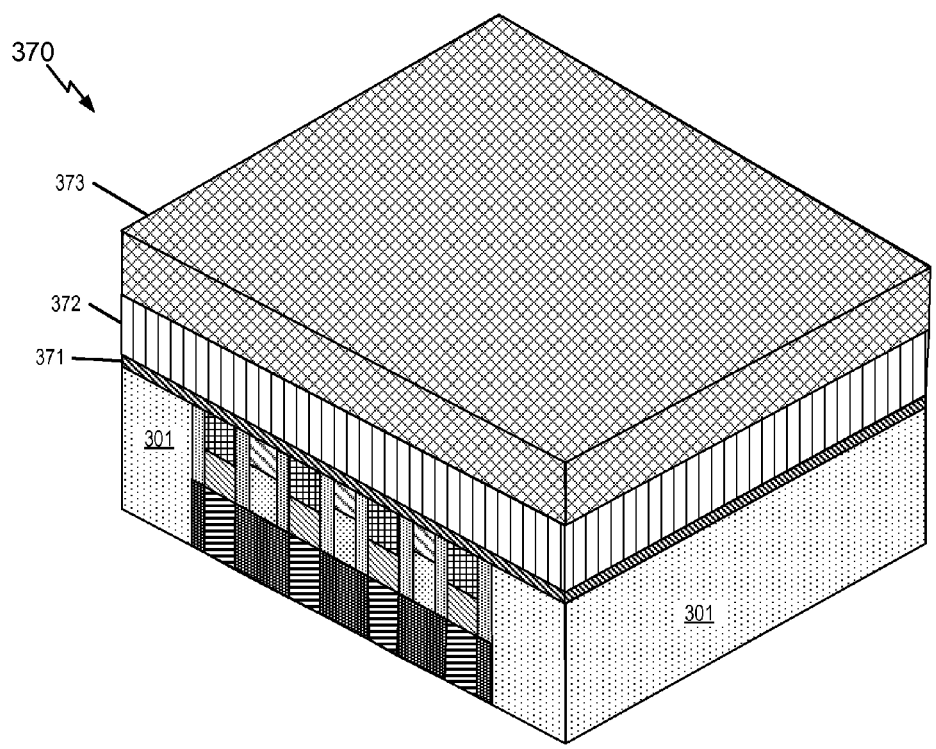

Referring to FIG. 3H, an eighth stage of the second fabrication process is depicted and generally designated 370. In FIG. 3H, an etch stop layer 371, a dielectric layer 372, and a first resist 373 have been deposited.

Figure 3I:
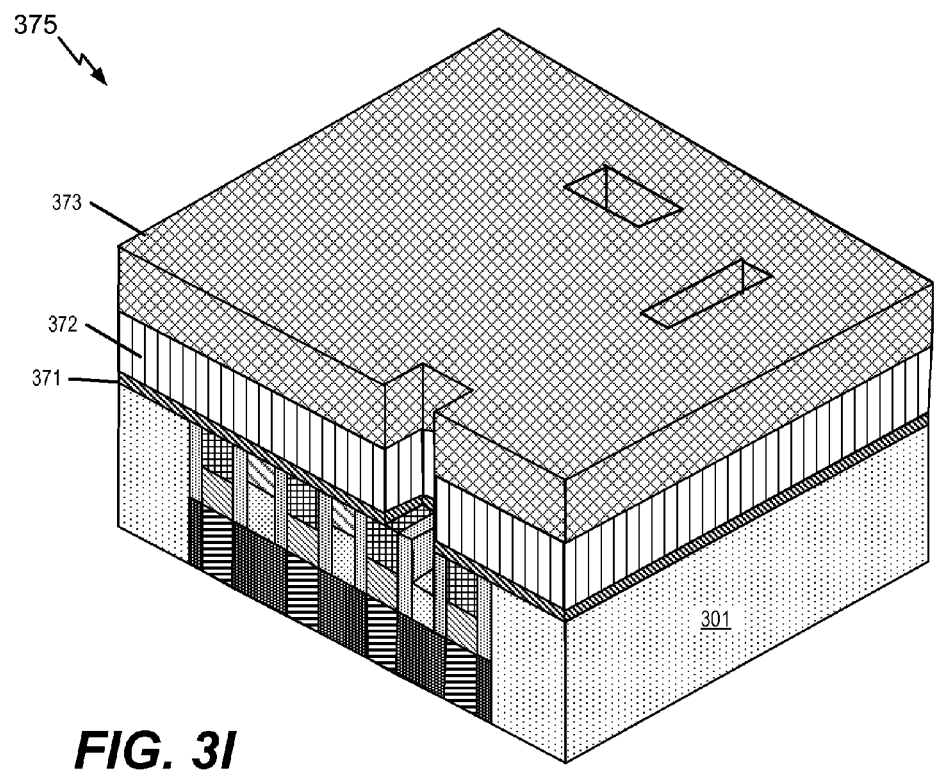

Referring to FIG. 3I, a ninth stage of the second fabrication process is depicted and generally designated 375. In FIG. 3I, a source/drain contact pattern has been applied to the first resist 373 and a first etching process has been performed to remove potions of one or more of the source/drain hardmask structures 341-343. For example, a portion of a particular source/drain hardmask structure 343 has been removed to expose a portion of the source/drain structure 333. However, the first etching process did not remove a portion of the gate hardmask structure 308 or a portion of the spacer structure 366. The etching process performed between the eighth stage 370 and the ninth stage 375 may correspond to the first etching as described with reference to FIG. 2C.

Figure 3J:
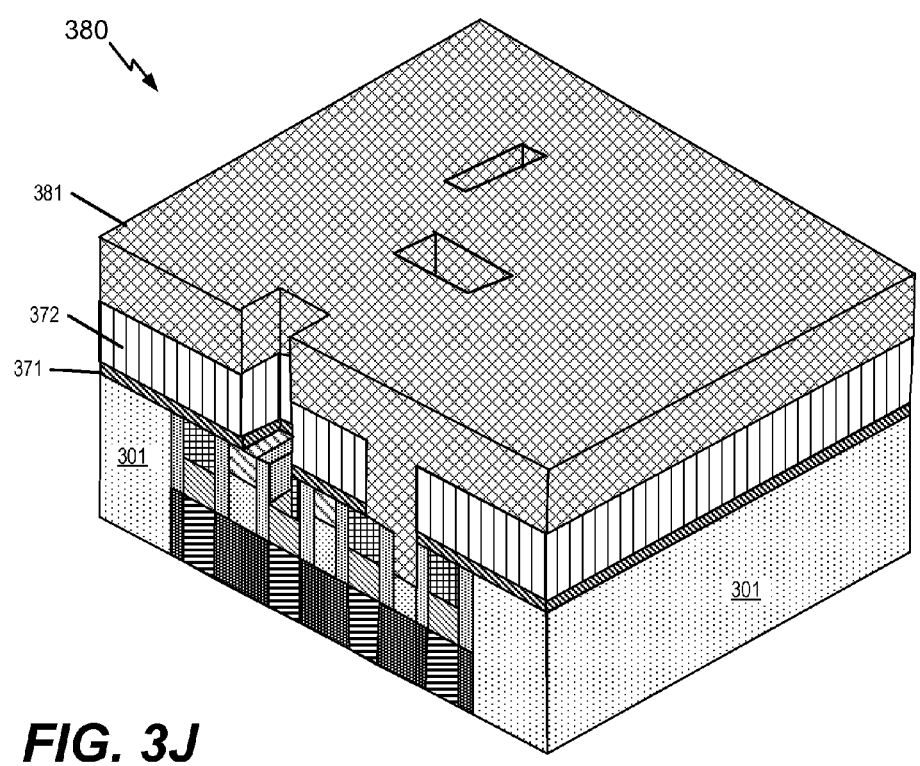

Referring to FIG. 3J, a tenth stage of the second fabrication process is depicted and generally designated 380. In FIG. 3J, the first resist 373 has been removed and a second resist 381 has been formed. A gate contact pattern has been applied to the second resist 381 and a second etching process has been performed to remove portions of one or more of the gate hardmask structures 306-309. For example, a portion of a particular gate hardmask structure 307 has been removed to expose a portion of the second gate structure 303. However, the second etching process did not remove a portion of the source/drain hardmask structure 341 or a portion of the spacer structure 363. The etching process performed between the ninth stage 375 and the tenth stage 380 may correspond to the first etching as described with reference to FIG. 2D.

After the tenth stage 380, the second resist 381 may be removed and a conductive material may be deposited. A planarization process may be performed to form contact structures (e.g., via structures), such as self-aligned contact structures.

Figure 4:
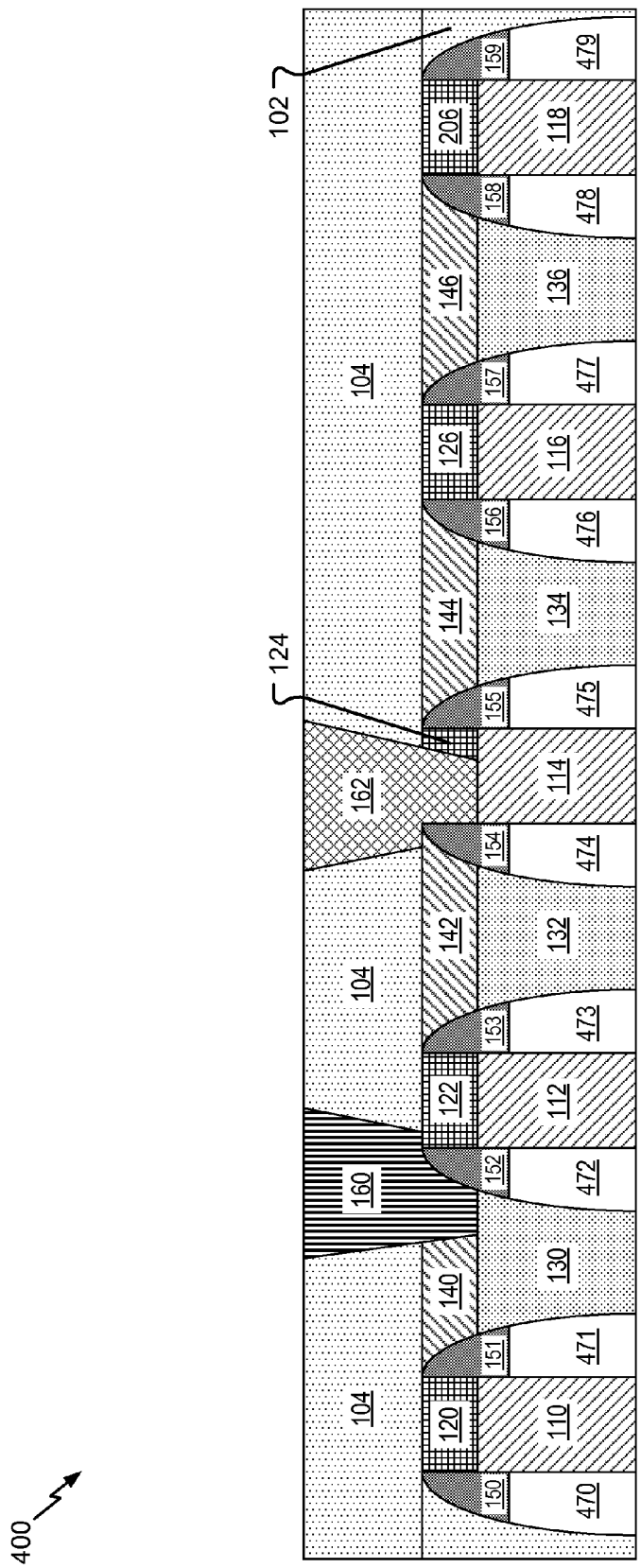

Referring to FIG. 4, a second particular illustrative aspect of a semiconductor device 400 that includes one or more self-aligned contacts is shown. For example, the semiconductor device 400 may include a self-aligned gate contact, a self-aligned source/drain contact (e.g., a drain contact), or a combination thereof. The semiconductor device 400 is shown in cross-sectional view. The semiconductor device 400 may be formed above (or on) a substrate (not shown). In some implementations, the semiconductor device 400 is a fin-type semiconductor device and may be associated with 7 nm technology or below. The semiconductor device 400 may include or correspond to the semiconductor device 100 of FIG. 1A.

The semiconductor device 400 includes the spacer structures 150-159. The spacer structures 150-159 may define gaps 470-479. For example, a first gap 470 may be defined by the first spacer structure 150. The first gap 470 may further be defined by the first gate structure 110, the first dielectric layer 102, a substrate (not shown), a first channel region (not shown), a first source/drain region (not shown), or a combination thereof. As another example, a second gap 472 may be defined by the third spacer structure 152. The second gap 472 may further be defined by the second gate structure 112, the first source/drain structure 130, the substrate (not shown), a second channel region (not shown), a second source/drain region (not shown), or a combination thereof In some implementations, the gaps 470-479 may be air gaps.

Figure 5A:
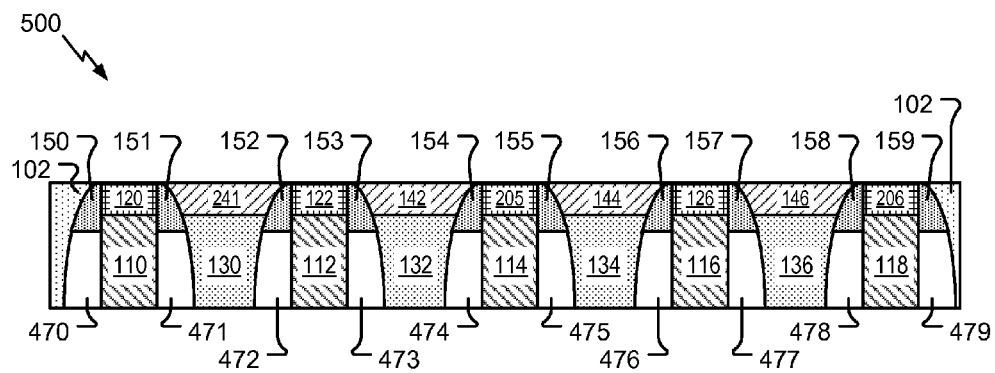
Figure 5B:
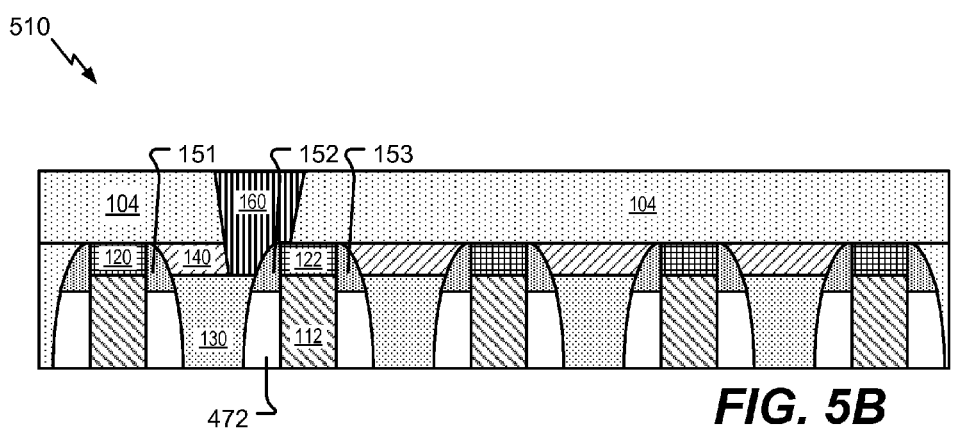
Figure 5C:
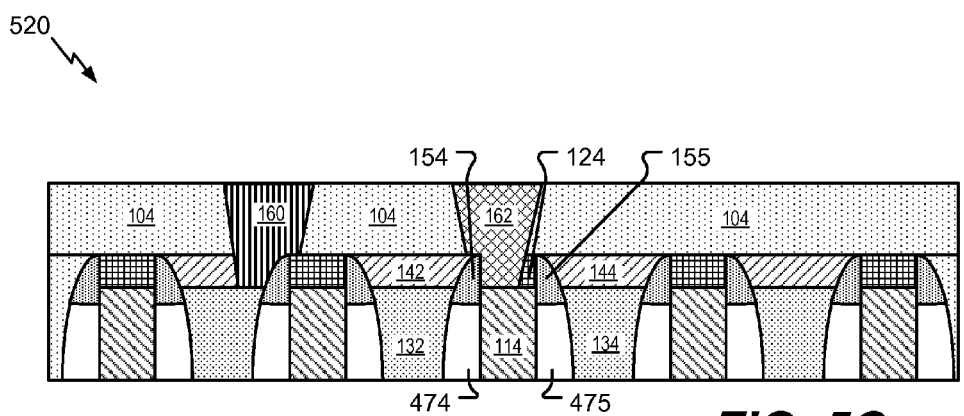

FIGS. 5A-C illustrate examples of stages of a third fabrication process that may be used to fabricate a semiconductor device. The stages of the third fabrication process are shown as cross-sectional views of formation of the semiconductor device. The semiconductor device may include the semiconductor device 100 of FIG. 1A or the semiconductor device 400 of FIG. 4. The semiconductor device may be a fin-type semiconductor device and may include one or more self-aligned structures, such as a self-aligned via structure, a self-aligned contact, or a combination thereof. The self-aligned via structure may include the first via structure 160, the second via structure 162, or the fourth via structure 174 of FIG. 1A.

Referring to FIG. 5A, a first stage of the third fabrication process is depicted and generally designated 500. FIG. 5A shows that spacer structures 150-159 have been formed to define gaps 470-479.

Referring to FIG. 5B, a second stage of the third fabrication process is depicted and generally designated 510. In FIG. 5B, the semiconductor device after formation of the second dielectric layer 104 and formation of the first via structure 160. In some implementations, an etch stop layer (not shown) may be deposited before the second dielectric layer 104 is formed. Formation of the first via structure 160 may include performing a first etching process that is selective to remove the second material (of the source/drain hardmask structure 241 of FIG. 5A) but not the first material (of the gate hardmask structures 120, 122, 126, 205, 206) or the third material (of the spacer structures 150-159). The first etching process may result in forming the first source/drain hardmask structure 140. After the first etching process is performed, a conductive material may be deposited and a planarization process may be performed to form the first via structure 160.

Referring to FIG. 5C, a third stage of the third fabrication process is depicted and generally designated 520. FIG. 5C shows the semiconductor device is shown after formation of the second via structure 162. Formation of the second via structure 162 may include performing a second etching process that is selective to remove the first material (of the gate hardmask structure 205 of FIG. 5A) but not the second material (of the source/drain hardmask structures 140-146) or the third material (of the spacer structures 150-159). The second etching process may form the third gate hardmask structure 124 by removing a portion of the gate hardmask structure 205 of FIG. 5A. After the second etching process is performed, a conductive material may be deposited and a planarization process may be performed to form the second via structure 162.

Figure 6A:
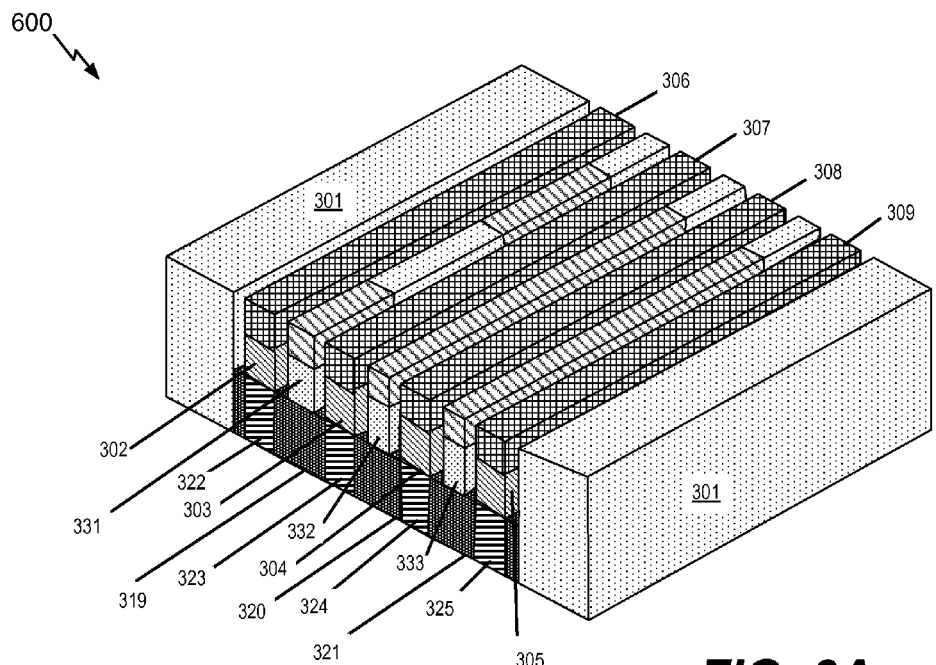
Figure 6B:
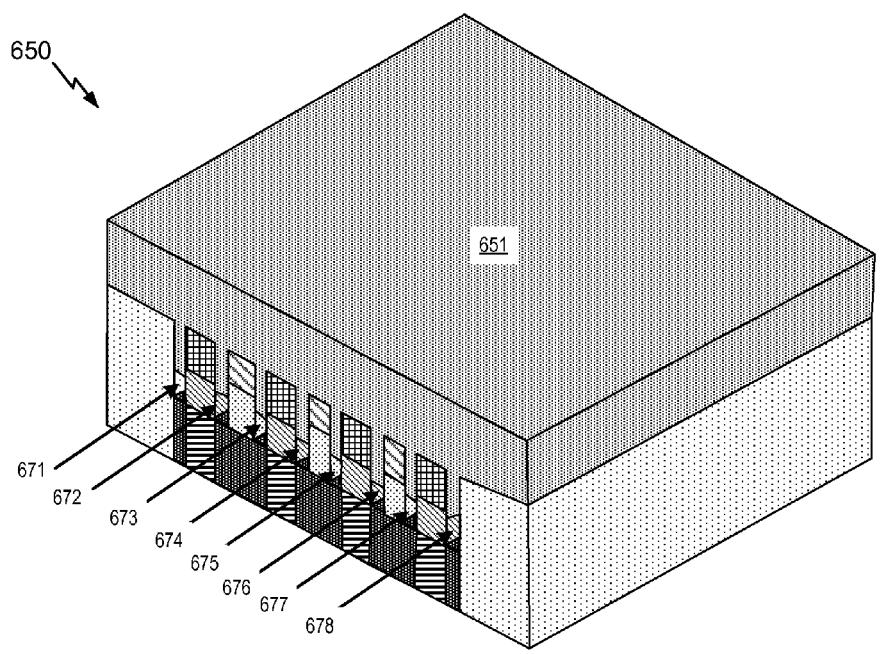

FIGS. 6A-B illustrate examples of stages of a fourth fabrication process that may be used to fabricate a semiconductor device. The stages of the fourth fabrication process are shown as cross-sectional isometric views of formation of the semiconductor device. The semiconductor device may include the semiconductor device 100 of FIG. 1A or the semiconductor device 400 of FIG. 4. The semiconductor device may be a fin-type semiconductor device and may include one or more self-aligned structures, such as a self-aligned via structure, a self-aligned contact, or a combination thereof. The self-aligned via structure may include the first via structure 160, the second via structure 162, or the fourth via structure 174 of FIG. 1A.

Referring to FIG. 6A, a first stage of the fourth fabrication process is depicted and generally designated 600. FIG. 6A shows formation of a semiconductor device after sacrificial spacer structures (e.g., dummy spacer structures) have been removed. In some implementations, the first stage 600 may correspond to the fifth stage 345 of the second fabrication process depicted at FIG. 3E.

Referring to FIG. 6B, a second stage of the fourth fabrication process is depicted and generally designated 630. In FIG. 6B, a third material 651 has been deposited. The third material 651 may correspond to the third material having the third etch selectivity, as described with reference to FIG. 1A. In some implementations, the third material 651 may include a low-k dielectric material. The third material 651 may have been conformally deposited to define gaps 671-678. The gaps 671-678, such as air gaps, may include one or more of the gaps 470-479 of FIG. 4.

Figure 7:
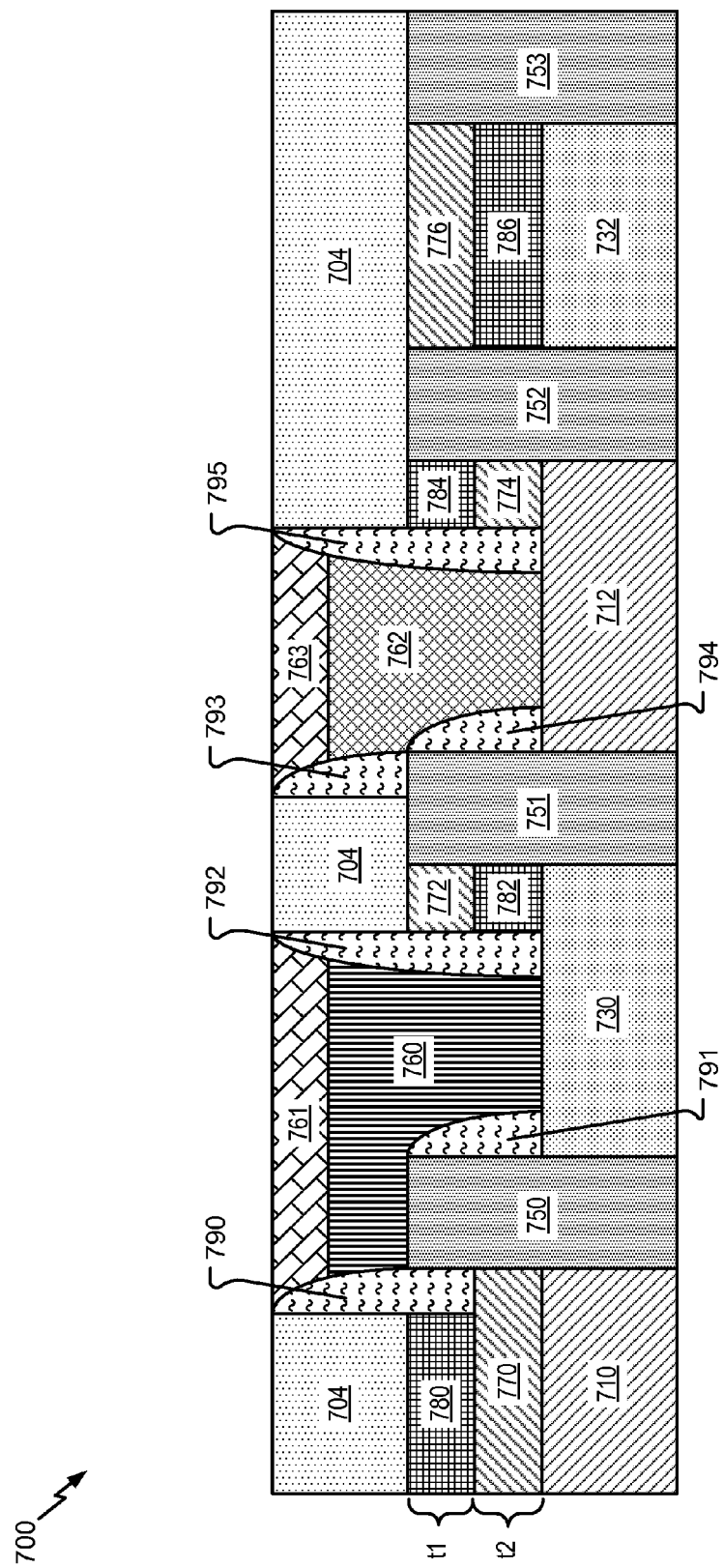

Referring to FIG. 7, a third particular illustrative aspect of a semiconductor device 700 that includes one or more self-aligned contacts is shown. For example, the semiconductor device 700 may include a self-aligned gate contact, a self-aligned source/drain contact (e.g., a drain contact), or a combination thereof. The semiconductor device 700 is shown in cross-sectional view. The semiconductor device 700 may be formed above (or on) a substrate (not shown). In some implementations, the semiconductor device 700 is a fin-type semiconductor device and may be associated with 7 nm technology or below. The semiconductor device 700 may include or correspond to the semiconductor device 100 of FIG. 1A or the semiconductor device 400 of FIG. 4.

The semiconductor device may include a dielectric layer 704. The dielectric layer 704 may correspond to the second dielectric layer 104 of FIG. 1A. The semiconductor device may include a first gate structure 710 and a second gate structure 712. The gate structures 710-712 may correspond to the gate structures 110-118 of FIG. 1A or the gate structures 302-305 of FIG. 3. The semiconductor device 700 may include a first source/drain structure 730 and a second source/drain structure 732. The source/drain structures 730-732 may correspond to the source/drain structures 130-136 of FIG. 1A or the source/drain structures 331-333 of FIG. 3.

One or more of the gate structures 710-712 may have a first multi-layer hardmask structure, such as a bi-layer hardmask structure, coupled to the gate structure. Each of the first multi-layer hardmask structures may include a hardmask structure 780, 784 (having the first material) and a hardmask structure 770, 774 (having the second material). For example, the hardmask structures 780, 784 may include a first material, such as the first material of the gate hardmask structures 120-128 of FIG. 1A, and the hardmask structures 770, 774 may include a second material, such as the second material of the source/drain hardmask structures 140-146 of FIG. 1A. The hardmask structure 770, 774 (having the second material) may be positioned between the hardmask structure 780, 784 (having the first material) and the gate structure 710, 712.

One or more of the source/drain structures 730-732 may include a second multi-layer hardmask structure, such as a bi-layer hardmask structure, coupled to the source/drain structure. Each of the second multi-layer hardmask structures may include a hardmask structure 772, 776 (having the second material) and a hardmask structure 782, 786 (having the first material). For example, the hardmask structures 782, 786 may include the first material, such as the first material of the gate hardmask structures 120-128 of FIG. 1A, and the hardmask structures 772, 776 may include the second material, such as the second material of the source/drain hardmask structures 140-146 of FIG. 1A. The hardmask structures may be positioned between the source/drain structures 730, 732 and the hardmask structures 772, 776. For example, the hardmask structure 782 may be positioned between the first source/drain structure 730 and the hardmask structure 772.

Different layers (e.g., structures) of the multi-layer hardmask structures may have different thicknesses or may have the same thickness. For example, the top layer (e.g., structures) of the first multi-layer hardmask structures and the top layer of the second multi-layer hardmask structures may have a first thickness (t1). The bottom layer (e.g., structures) of the first multi-layer hardmask structures and the bottom layer of the second multi-layer hardmask structures may have a second thickness (t2). In some implementations, the first thickness may be greater than the second thickness (t2). In other implementations, the first thickness may be the same as or less than the second thickness (t2).

The semiconductor device 700 may include spacer structures 750-753. The spacer structures 750-753 may correspond to the spacer structures 150-159 of FIG. 1A or the spacer structures 361-368 of FIG. 3. The spacer structures 750-753 may include the first material, the second material, or a third material, such as the third material of the spacer structures 150-159 of FIG. 1A. For example, the spacer structures 750-753 may substantially include the first material. As another example, the spacer structures 750-753 may substantially include the second material. As another example, the spacer structures 750-753 may substantially include the third material.

The semiconductor device 700 may include additional spacer structures 790-795. The semiconductor device 700 may also include a first via structure 760 and a second via structure 762. The first via structure 760 may include the first via structure 160 of FIG. 1A. In some implementations, the first via structure 760 may include a first cap 761. The second via structure 762 may include the second via structure 162 of FIG. 1A. In some implementations, the second via structure 762 may include a second cap 763 of FIG. 7. The multi-layer hardmask structures shown in FIG. 7 may be used to protect against shorts in case of misalignment of one or more structures (e.g., self-aligned structures) during fabrication, as further described with reference to FIGS. 8A-I.

FIGS. 8A-I illustrate examples of stages of a fifth fabrication process that may be used to fabricate a semiconductor device. The stages of the fifth fabrication process are shown as cross-sectional views of formation of the semiconductor device. The semiconductor device may include the semiconductor device 100 of FIG. 1A, the semiconductor device 400 of FIG. 4, or the semiconductor device 700 of FIG. 7. The semiconductor device may be a fin-type semiconductor device and may include one or more self-aligned structures, such as a self-aligned via structure, a self-aligned contact, or a combination thereof. The self-aligned via structure may include the first via structure 160, the second via structure 162, the fourth via structure 174 of FIG. 1A, the first via structure 760, or the second via structure 762 of FIG. 2.

Figure 8A:
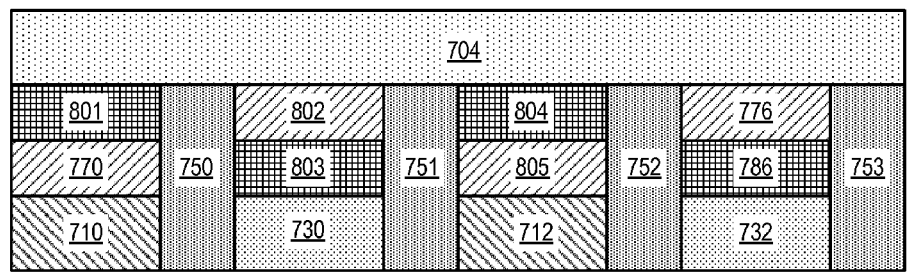

Referring to FIG. 8A, a first stage of the fifth fabrication process is depicted and generally designated 800. FIG. 8A shows the dielectric layer 704 that has been formed during formation of a semiconductor device. The dielectric layer 704 has been formed above the gate structures 710-712, the source/drain structures 730/732, and the spacer structures 750-753. A first group of hardmask structures 770, 776, 802, 805 include a first material, such as the first material of the gate hardmask structures 120-128 of FIG. 1A. A second group of hardmask structures 786, 801, 803, 804 include a second material, such as the first material of the gate hardmask structures 120-128 of FIG. 1A. The first material and the second material may have different etch selectivity.

Figure 8B:
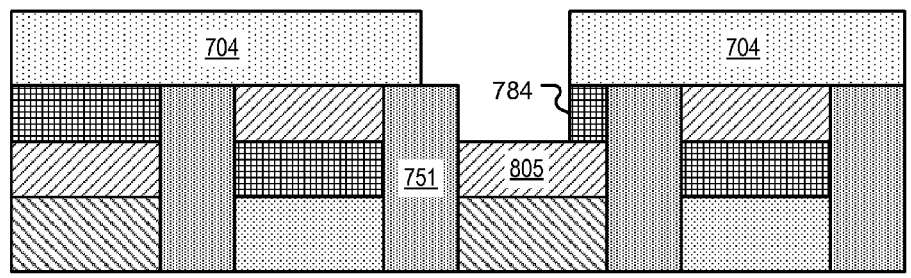

Referring to FIG. 8B, a second stage of the fifth fabrication process is depicted and generally designated 820. In FIG. 8B, the dielectric layer 704 and the first hardmask structure (e.g., a first gate hardmask structure) 804 of FIG. 8A have been etched. A first gate pattern may have been applied to the dielectric layer of FIG. 8A and a first etching process may have been initiated. The first etching process may include a first etch stage and a second etch stage. To illustrate, a portion of a first hardmask structure (e.g., the first gate hardmask structure) 804 has been etched (e.g., removed using a plasma etch, a dry etch, etc.) during a first etch stage to form the second hardmask structure 784 and to expose a portion of the third hardmask structure (e.g., a second gate hardmask structure) 805. The first etch stage may leave the second material of the third hardmask structure (e.g., the second gate hardmask structure) 805 intact. In some implementations, if the spacer structures 750-753 include the third material, such as the third material of the spacer structures 150-159 of FIG. 1A, the first etch stage may leave the third material of the spacer structures 750-753 intact.

Figure 8C:
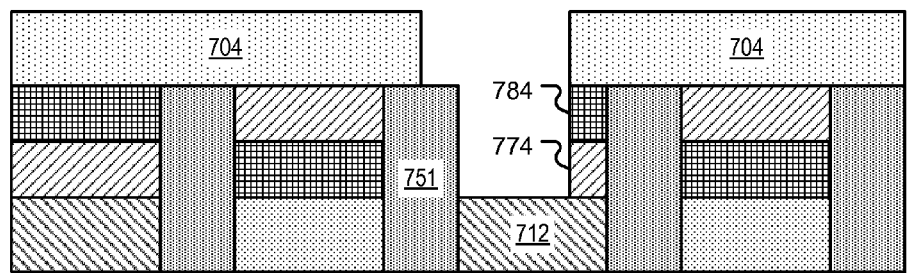

Referring to FIG. 8C, a third stage of the fifth fabrication process is depicted and generally designated 830. FIG. 8C shows the semiconductor device after the second etch stage of the first etching process has been performed. A portion of the third hardmask structure (e.g., the second gate hardmask structure) 805 of FIG. 8B has been etched during the second etch stage to form a fourth hardmask structure 774 and to expose a portion of the gate structure 712. The second etch stage may leave the first material (of the second hardmask structure 784). In some implementations, if the spacer structures 750-753 include the third material, such as the third material of the spacer structures 150-159 of FIG. 1A, the second etch stage may leave the third material of the spacer structures 750-753 intact.

Figure 8D:
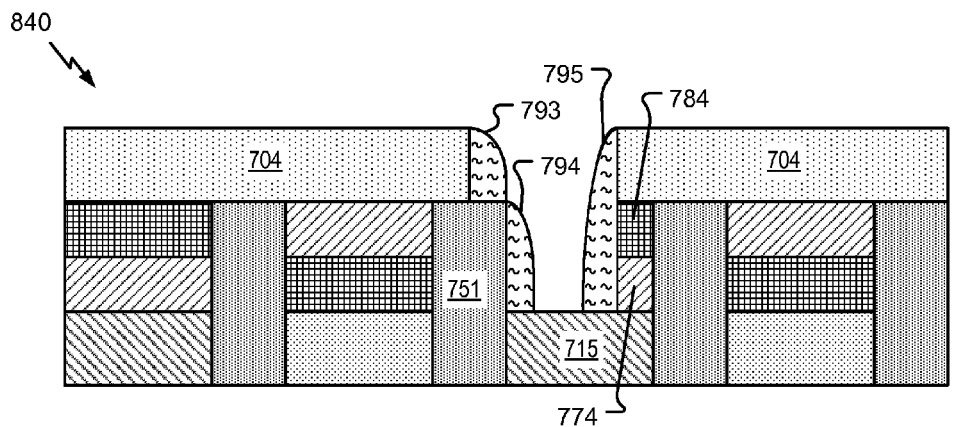

Referring to FIG. 8D, a fourth stage of the fifth fabrication process is depicted and generally designated 840. FIG. 8D shows the semiconductor device after formation of the additional spacer structures 793-795, such as sidewall spacer structures. The formation of the additional spacer structures 793-795 may be optional. Forming the additional spacer structures 793-795 may increase a process window associated with formation of one or more structures after the additional spacer structures 793-795 have been formed.

Figure 8E:
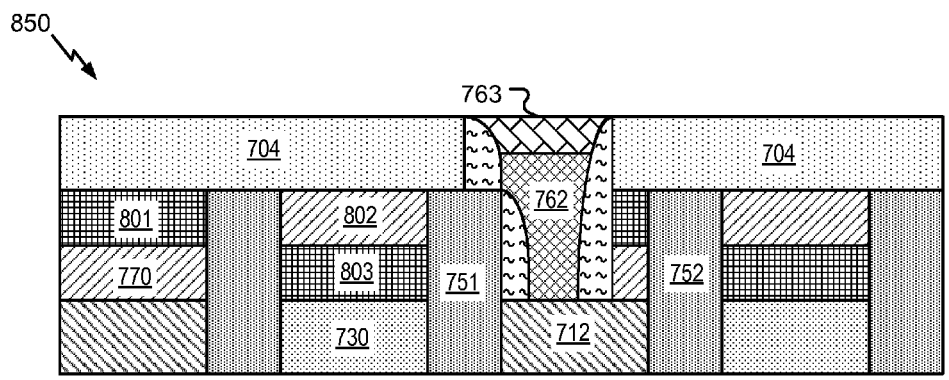

Referring to FIG. 8E, a fifth stage of the fifth fabrication process is depicted and generally designated 850. FIG. 8E shows the semiconductor device metal after a fill operation has been completed to deposit a first conductive material of the second via structure 762. After the first conductive material is deposited, a planarization process, such as a chemical mechanical planarization (CMP) process, is performed and the second cap 763 is subsequently formed. In some implementations, formation of the second cap 763 is optional. To form the second cap 763, the first conductive material may be recessed to form the second via structure 762, a first capping material may be deposited, and a planarization may be performed on the first capping material to form the second cap 763.

Figure 8F:
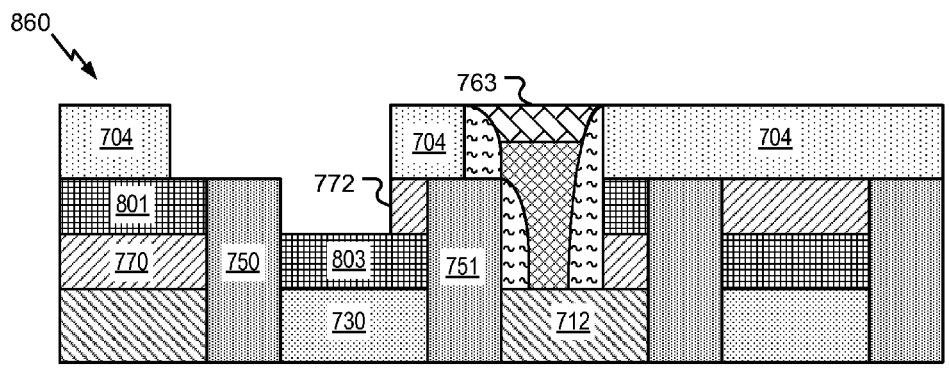

Referring to FIG. 8F, a sixth stage of the fifth fabrication process is depicted and generally designated 860. FIG. 8F shows the semiconductor device after the dielectric layer 704 and a fifth hardmask structure 802 of FIG. 8A have been etched. A second gate pattern may have been applied to the dielectric layer 704 of FIG. 8E and a second etching process may have been initiated. The second etching process may include a third etch stage and a fourth etch stage. To illustrate, a portion of the fifth hardmask structure 802 has been etched (e.g., removed using a plasma etch, a dry etch, etc.) during the third etch stage to form a sixth hardmask structure 772 and to expose a portion of a seventh hardmask structure 803 and to expose a portion of an eighth hardmask structure 801 of FIG. 8A. The third etch stage may leave the first material of the seventh hardmask structure 803 intact. In some implementations, if the spacer structures 750-753 include the third material, such as the third material of the spacer structures 150-159 of FIG. 1A, the third etch stage may leave the third material of the spacer structure 750-753 intact.

Figure 8G:
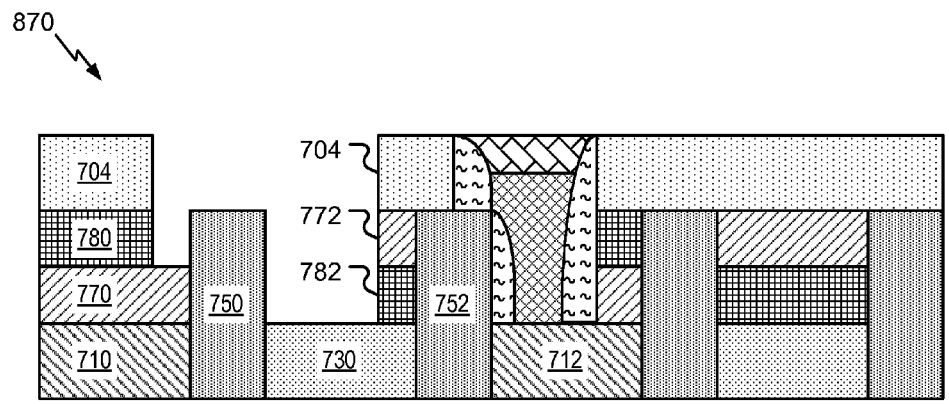

Referring to FIG. 8G, a seventh stage of the fifth fabrication process is depicted and generally designated 870. FIG. 8G shows the semiconductor device after the fourth etch stage of the second etching process has been performed. A portion of the seventh hardmask structure 803 of FIG. 8A has been etched during the fourth etch stage to form a ninth hardmask structure 782 and to expose a portion of the first source/drain structure 730. A portion of the eighth hardmask structure 801 of FIG. 8A have been etched during the fourth etch stage to form a tenth hardmask structure 780 and to expose a portion of an eleventh hardmask structure 770. The fourth etch stage may leave the second material of the sixth hardmask structure 722 intact. In some implementations, if the spacer structures 750-753 include the third material, such as the third material of the spacer structures 150-159 of FIG. 1A, the fourth etch stage may leave the third material of the spacer structures 750-753 intact.

Figure 8H:
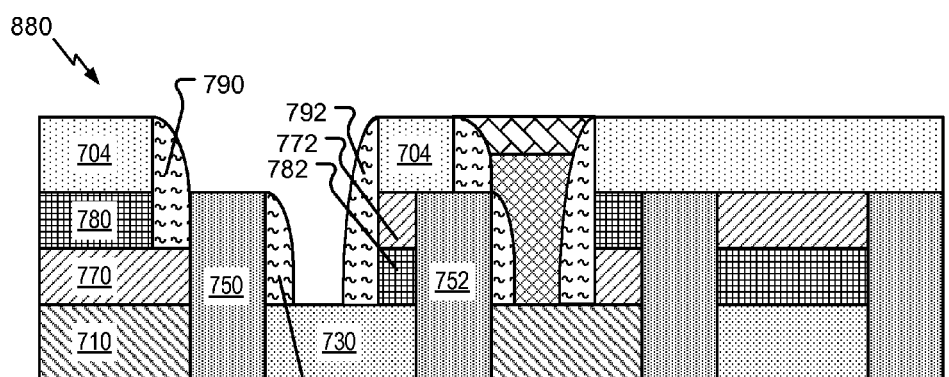

Referring to FIG. 8H, an eighth stage of the fifth fabrication process is depicted and generally designated 880. FIG. 8H shows the semiconductor device after formation of the additional spacer structures 790-792, such as sidewall spacer structures. The formation of the additional spacer structures 790-792 may be optional. Forming the additional spacer structures 793-795 may increase a process window associated with formation of one or more structures after the additional spacer structures 790-792 have been formed.

Figure 8I:
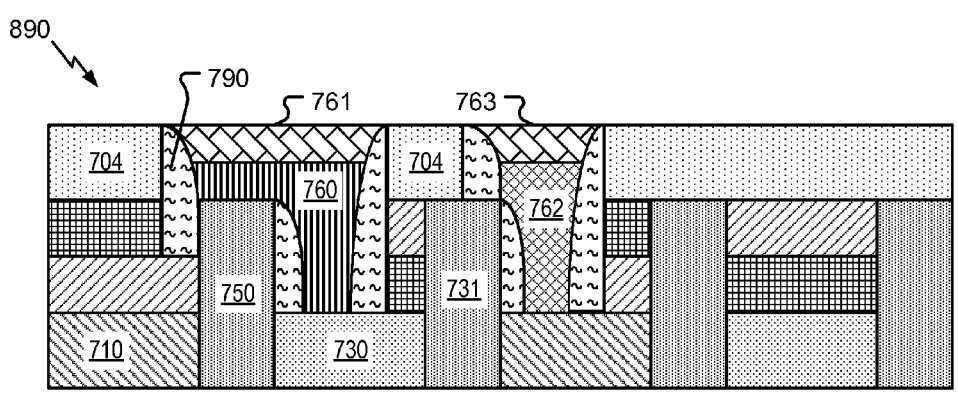

Referring to FIG. 8I, a ninth stage of the fifth fabrication process is depicted and generally designated 890. FIG. 8H shows the semiconductor device after a fill operation has been completed to deposit a second conductive material of the first via structure 760. The second conductive material may be the same as or different from the first conductive material. After the second conductive material is deposited, a planarization process, such as a chemical mechanical planarization (CMP) process, is performed and the first cap 761 is subsequently formed. In some implementations, formation of the first cap 761 is optional. To form the first cap 761, the second conductive material may be recessed to form the first via structure 760, a second capping material may be deposited, and a planarization may be performed on the second capping material to form the first cap 761. The second capping material may be the same as or different from the first capping material.

Figure 9:
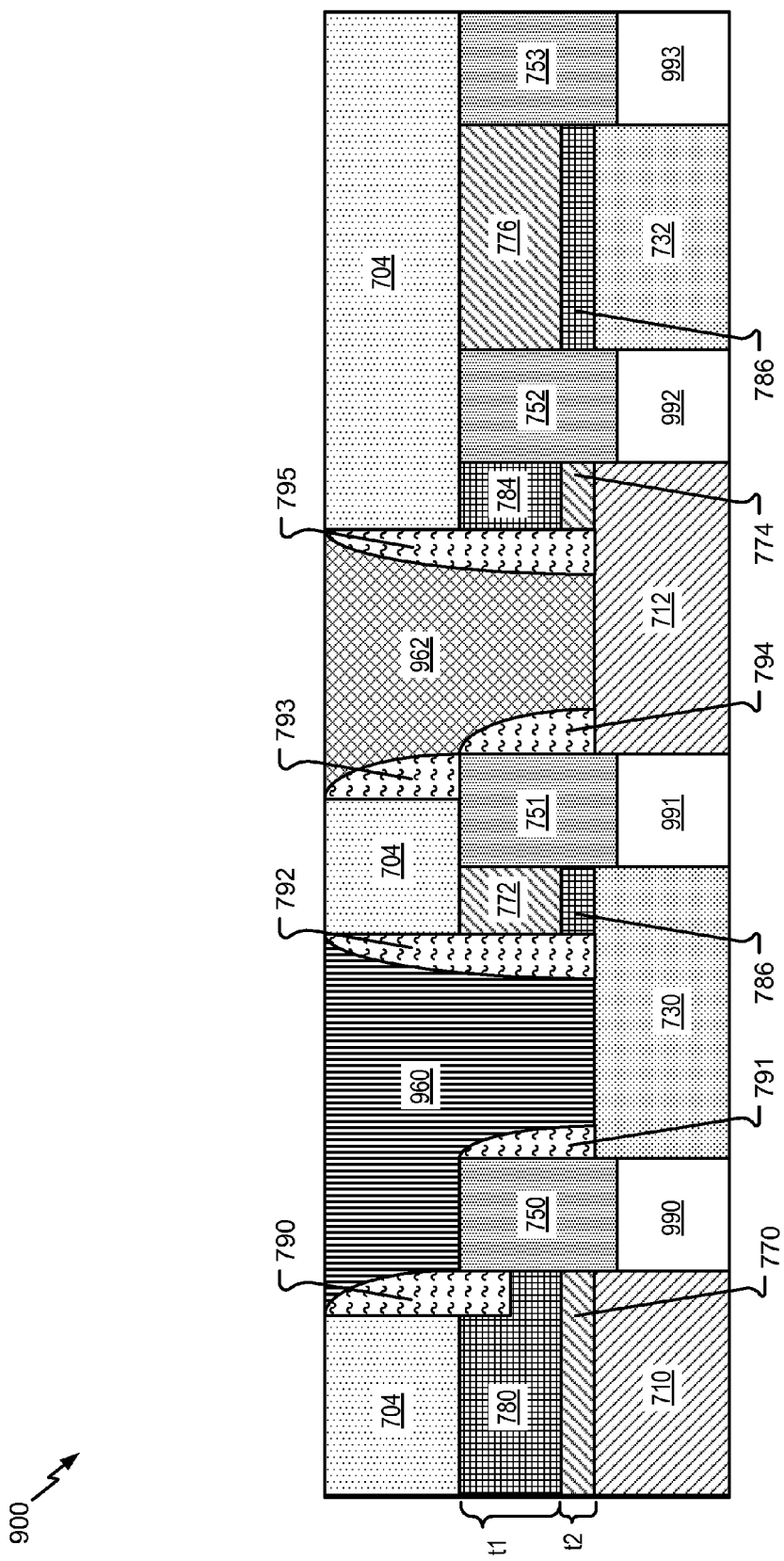
FIG. 9 is a block diagram of a particular illustrative aspect of a semiconductor device that includes a self-aligned structure.

Referring to FIG. 9, a fourth particular illustrative aspect of a semiconductor device 900 that includes one or more self-aligned contacts is shown. For example, the semiconductor device 900 may include a self-aligned gate contact, a self-aligned source/drain contact (e.g., a drain contact), or a combination thereof. The semiconductor device 900 is shown in cross-sectional view. The semiconductor device 900 may be formed above (or on) a substrate (not shown). In some implementations, the semiconductor device 900 is a fin-type semiconductor device and may be associated with 7 nm technology or below. The semiconductor device 900 may include or correspond to the semiconductor device 100 of FIG. 1A, the semiconductor device 400 of FIG. 4, or the semiconductor device 700 of FIG. 7.

The semiconductor device 900 includes the spacer structures 750-753. The spacer structures 750-753 may define gaps 990-993. For example, a first gap 990 may be defined by the first spacer structure 750. The first gap 990 may further be defined by the first gate structure 710, the first source/drain structure 730, a substrate (not shown), a first channel region (not shown), a first source/drain region (not shown), or a combination thereof. The gaps 990-993 may correspond to the gaps 470-479 of FIG. 4 or the gaps 671-678 of FIG. 6. In some implementations, the gaps 990-993 may be air gaps. In other implementations, the gaps 990-993 may be vacuums.

The semiconductor device 900 includes a first via structure 960 and a second via structure 962. The first via structure 960 may include the first via structure 160 of FIG. 1A or the first via structure 760 of FIG. 7. In some implementations, the first via structure 960 may include a cap, such as the first cap 761 of FIG. 7. The second via structure 962 may include the second via structure 162 of FIG. 1A or the second via structure 762 of FIG. 7. In some implementations, the second via structure 962 may include a cap, such as the second cap 763 of FIG. 7. Additionally, as illustrated in FIG. 9, the first thickness (t1) is greater than the second thickness (t2). Although the first thickness (t1) is illustrated as being greater than the second thickness (t2), in other implementations, the first thickness (t1) may be the same as or less than the second thickness (t2).

Figure 10:
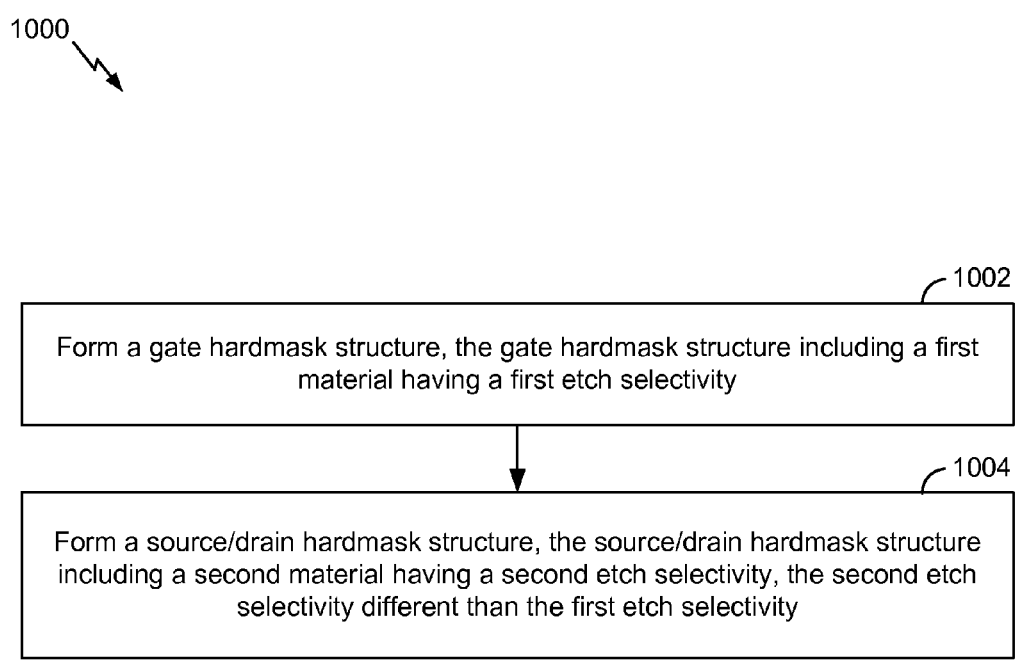
FIG. 10 is a flow chart that illustrates a first method of fabricating a semiconductor device that includes a self-aligned structure.

Referring to FIG. 10, a flow diagram of an illustrative method of forming a semiconductor device is depicted and generally designated 1000. The semiconductor device may include or correspond to the semiconductor device 100 of FIG. 1A, the semiconductor device 400 of FIG. 4, the semiconductor device 700 of FIG. 7, or the semiconductor device 900 of FIG. 9. The semiconductor device may be a fin-type semiconductor device and may include one or more self-aligned structures, such as one or more self-aligned contacts. The one or more self-aligned structures may include the first via structure 160, the second via structure 162, the fourth via structure 174 of FIG. 1A, the first via structure 760, the second via structure 762 of FIG. 7, the first via structure 960, or the second via structure 962 of FIG. 9.

The method 1000 includes forming a gate hardmask structure, at 1002. For example, the gate hardmask structure may include or be associated with the gate hardmask structures 120-128 of FIG. 1A, the gate hardmask structures 205, 206 depicted in FIGS. 2A-2F, the gate hardmask structures 306-309 depicted in FIGS. 3A-3J, the hardmask structures 770, 774, 780, 784 of FIG. 7, or the hardmask structures 801, 804, 805 depicted in FIGS. 8A-F. The gate hardmask structure may include (e.g., substantially comprise) a first material having a first etch selectivity.

The method 1000 further includes forming a source/drain hardmask structure, at 1004. For example, the source/drain hardmask structure may include or be associated with the source/drain hardmask structures 140-146 of FIG. 1A, the source/drain hardmask structures 241 depicted in FIG. 2B, the source/drain hardmask structures 341-343 depicted in FIGS. 3D-3J, the hardmask structures 772, 776, 782, 786 of FIG. 7, or the hardmask structures 802, 803 in FIGS. 8A-F. The source/drain hardmask structure may include (e.g., substantially comprise) a second material having a second etch selectivity. The first material and the second material may be different materials. The second etch selectivity may be different from the first etch selectivity. In some implementations, forming the gate hardmask structure and forming the source/drain hardmask structure are initiated at or controlled by a controller of a fabrication system.

In some implementations, the method 1000 may include performing a second etching process to remove a portion of the source/drain hardmask structure and to expose a portion of a source/drain structure, and forming a self-aligned source/drain via structure that is in contact with the source/drain structure. Additionally or alternatively, the method 1000 may include performing a first etching process to remove a portion of the gate hardmask structure and to expose a portion of a gate structure, and forming a self-aligned gate via structure that is in contact with the gate structure.

In some implementations, the method 1000 may include forming a spacer structure that includes a third material having a third etch selectivity. For example, the spacer structure may correspond to the spacer structures 150-159 of FIG. 1A, the spacer structures 361-368 as depicted in FIGS. 3G-J, or the spacer structures 750-753 of FIG. 7. The third etch selectivity may be different from the first etch selectivity, the second etch selectivity, or both. In some implementations, the third etch selectivity may be the same as one of the first etch selectivity or the second etch selectivity. For example, the third material may be the same as the first material or the second material. At least a portion of the spacer structure may be positioned between the gate hardmask structure and the source/drain hardmask structure. Forming the spacer structure defines a gap, such as an air gap.

In some implementations, the method 1000 may include forming a first etch mask (e.g., a first resist) and performing a first etching process to remove a portion of the gate hardmask structure and to expose a portion of a gate structure. For example, the gate structure may correspond to the gate structures 110-118 of FIG. 1A, the gate structures 302-305 as depicted in FIG. 3A-3J, or the gate structures 710, 712 of FIG. 7. After the first etching process is performed, the first etch mask may be removed and a first via structure may be formed that is coupled to the gate structure. For example, the first via structure may correspond to the first via structure 160 of FIG. 1A, the first via structure 760 of FIG. 7, or the first via structure 960 of FIG. 9.

In some implementations, the method 1000 may include forming a second etch mask (e.g., a second resist) and performing a second etching process to remove a portion of the source/drain hardmask structure and to expose a portion of a source/drain structure. For example, the source/drain structure may correspond to the source/drain structures 130-136 of FIG. 1A, the source/drain structures 331-333 as depicted in FIGS. 3B-3J, or the source/drain structures 730, 732 of FIG. 7. After the second etching process is performed, the second etch mask may be removed and a second via structure may be formed that is coupled to the source/drain structure. For example, the second via structure may correspond to the second via structure 162 of FIG. 1A, the second via structure 762 of FIG. 7, or the second via structure 962 of FIG. 9. In some implementations, the first via structure and the second via structure may be formed concurrently.

In a particular implementation, the method 1000 may include forming a second gate hardmask structure prior to forming the gate hardmask structure. The second gate hardmask structure may be positioned between a gate structure and the gate hardmask structure. The second gate hardmask structure may substantially include the second material. Additionally or alternatively, the method 1000 may include forming a second source/drain hardmask structure prior to forming the source/drain hardmask structure. The second source/drain hardmask structure may be positioned between a source/drain structure and the source/drain hardmask structure. The second source/drain hardmask structure may substantially include the first material. The method 1000 may include performing a first etching process that includes etching the gate hardmask to expose a portion of the second gate hardmask, and etching the second gate hardmask to expose a portion of a gate structure. Additionally or alternatively, the method 1000 may include performing a second etching process that includes etching the source/drain hardmask to expose a portion of the source/drain hardmask, and etching the second source/drain hardmask to expose a portion of a source/drain structure.

The method 1000 may be used to form self-aligned structures, such as self-aligned vias, self-aligned contacts, or a combination thereof. Additionally, the method 1000 may enable an increased tolerance of misaligned contacts and reduce a number of contacts that are shorted to another component of the semiconductor device without increasing a layout area of the semiconductor device at 7 nm and below.

Figure 11:
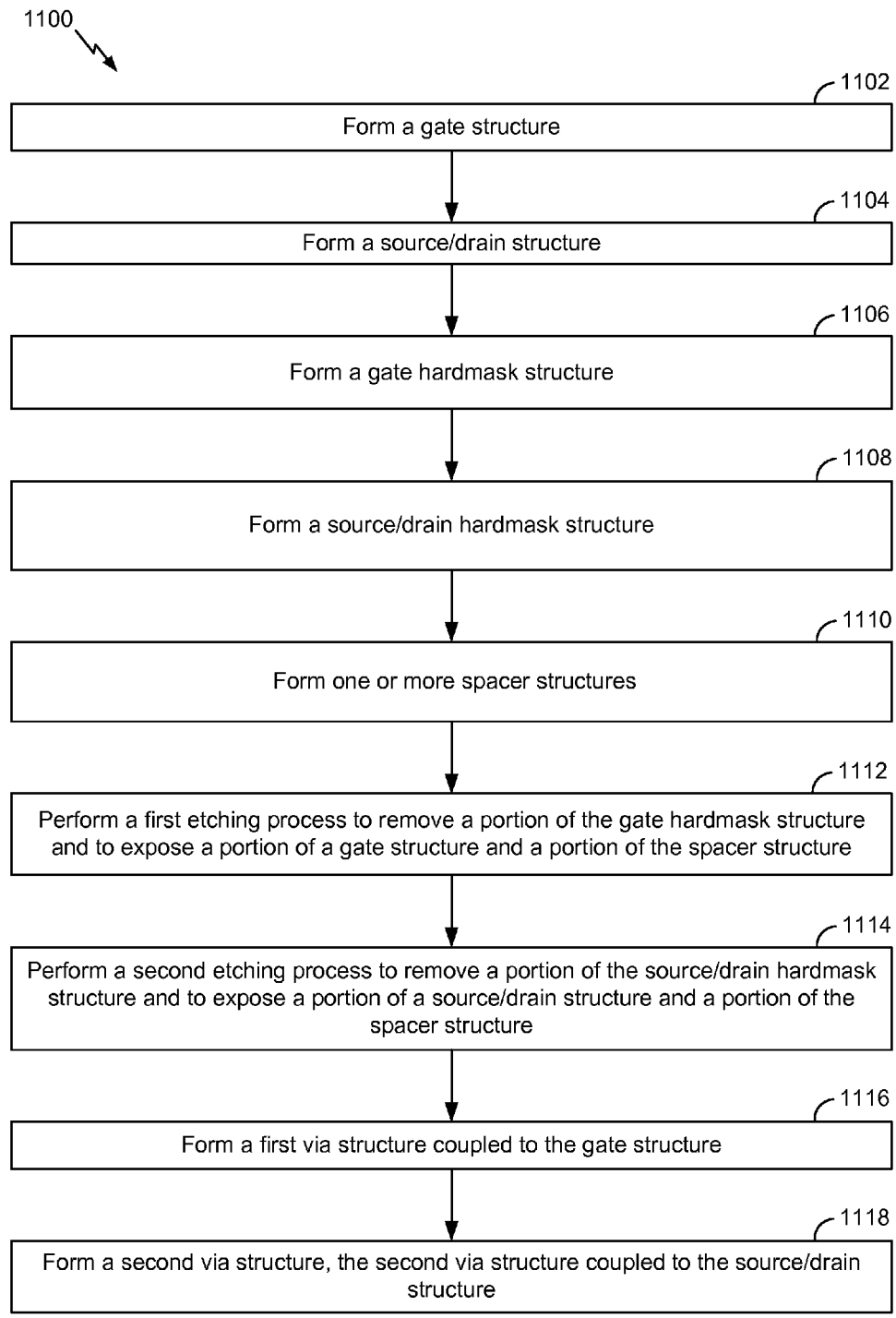
FIG. 11 is a flow chart that illustrates a second method of fabricating a semiconductor device that includes a self-aligned structure.

Referring to FIG. 11, a flow diagram of an illustrative method of forming a semiconductor device is depicted and generally designated 1100. The semiconductor device may include or correspond to the semiconductor device 100 of FIG. 1A, the semiconductor device 400 of FIG. 4, the semiconductor device 700 of FIG. 7, or the semiconductor device 900 of FIG. 9. The semiconductor device may be a fin-type semiconductor device and may include one or more self-aligned structures, such as one or more self-aligned contacts. The one or more self-aligned structures may include the first via structure 160, the second via structure 162, the fourth via structure 174 of FIG. 1A, the first via structure 760, the second via structure 762 of FIG. 7, the first via structure 960, or the second via structure 962 of FIG. 9.

The method 1100 may include forming a gate structure, at 1102. The method 1100 may further include forming a source/drain structure, at 1104. The method 1100 may further include forming a gate hardmask structure, at 1106. The gate hardmask structure may substantially include a first material associated with a first etch selectivity. The method 1100 may further include forming a source/drain hardmask structure, at 1108. The source/drain hardmask structure may substantially include a second material associated with a second etch selectivity. The first etch selectivity may be different from the second etch selectivity.

The method 1100 may further include forming one or more spacer structures, at 1110. The one or more spacer structures may include a third material having a third etch selectivity. The third etch selectivity may be different from or the same as the first etch selectivity, the second etch selectivity, or both.

The method 1100 may further include performing a first etching process to remove a portion of the gate hardmask structure, at 1112. Removing the portion of the gate hardmask structure may expose a portion of a gate structure, a portion of first spacer structure, or a combination thereof. The method 1100 may further include performing a second etching process to remove a portion of the source/drain hardmask structure, at 1114. Removing the portion of the source/drain hardmask structure may expose a portion of a source/drain structure, a second portion of a second spacer structure, or a combination thereof. The first etching process and the second etching process may be separate and distinct etching processes.

The method 1100 may further include forming a first via structure coupled to the gate structure, at 1116. In some implementations, the first via structure may be a first self-aligned structure, such as a self-aligned gate contact. The method 1100 may further include forming a second via structure coupled to the source/drain structure, at 1116. In some implementations, the second via structure may be a second self-aligned structure, such as a self-aligned source/drain contact.

The method 1100 may be used to form self-aligned structures, such as self-aligned vias, self-aligned contacts, or a combination thereof. Additionally, the method 1100 may enable an increased tolerance of misaligned contacts and reduce a number of contacts that are shorted to another component of the semiconductor device without increasing a layout area of the semiconductor device at 7 nm and below.

The process shown in FIGS. 2A-H, the process shown in FIGS. 3A-J, the process shown in FIGS. 5A-C, the process shown in FIGS. 6A-B, the process shown in FIGS. 8A-I, the method 1000 of FIG. 10, the method 1100 of FIG. 11, or a combination thereof, may be controlled by a processing unit such as a central processing unit (CPU), a controller, a field-programmable gate array (FPGA) device, an application-specific integrated circuit (ASIC), another hardware device, firmware device, or any combination thereof. As an example, the process shown in FIGS. 2A-H, the process shown in FIGS. 3A-J, the process shown in FIGS. 5A-C, the process shown in FIGS. 6A-B, the process shown in FIGS. 8A-I, the method 1000 of FIG. 10, the method 1100 of FIG. 11, or a combination thereof, can be performed by one or more processors that execute instructions to control fabrication equipment. It is understood that portions of one or more processes, such as the process shown in FIGS. 2A-H, the process shown in FIGS. 3A-J, the process shown in FIGS. 5A-C, the process shown in FIGS. 6A-B, or the process shown in FIGS. 8A-I, and portions of one or more methods, such as the method 1000 of FIG. 10, or the method 1100 of FIG. 11, may be combined. Additionally, one or more steps described with reference to the process shown in FIGS. 2A-H, the process shown in FIGS. 3A-J, the process shown in FIGS. 5A-C, the process shown in FIGS. 6A-B, the process shown in FIGS. 8A-I, portions of one or more methods, such as the method 1000 of FIG. 10 or the method 1100 of FIG. 11, or a combination thereof, may be optional, may be performed at least partially concurrently, may be performed in a different order than shown or described, or a combination thereof.

Figure 12:
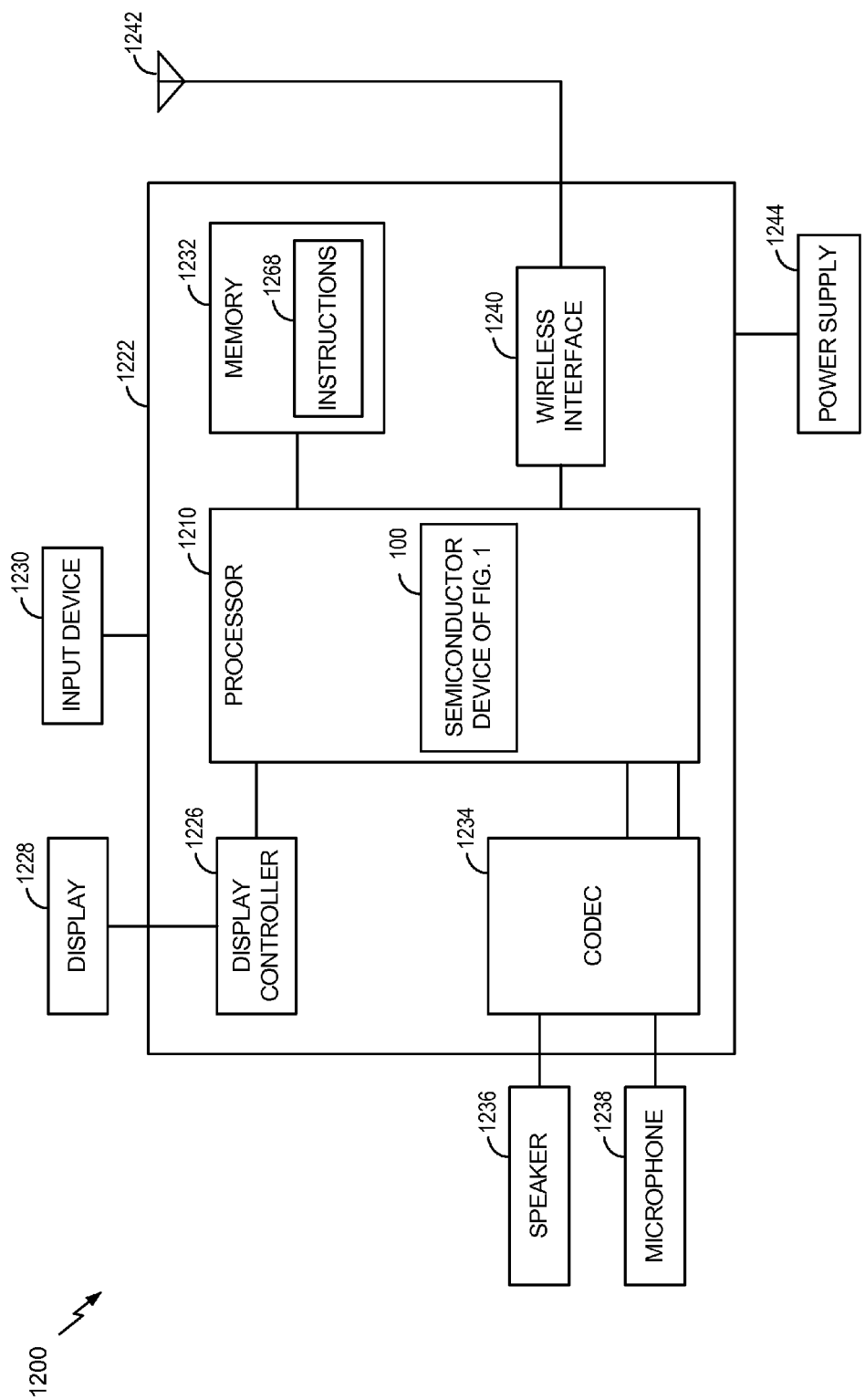
FIG. 12 is a block diagram of portable device including a self-aligned structure.

Referring to FIG. 12, a block diagram of a particular illustrative electronic device 1200, such as a wireless communication device, is depicted. The device 1200 includes a processor 1210, such as a digital signal processor (DSP), coupled to a memory 1232. The processor 1210, or components thereof, may include the semiconductor device 100 of FIG. 1A. Additionally or alternatively, the semiconductor device 100 may include or correspond to a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11. To illustrate, the processor 1210 may be constructed in such a way that components of the processor 1210 may be electrically connected to one or more self-aligned structures, such as the first via structure 160, the second via structure 162, the fourth via structure 174 of FIG. 1A, that are included in the semiconductor device 100. Additionally or alternatively, the one or more self-aligned structures may include the first via structure 760, the second via structure 762 of FIG. 7, the first via structure 960, or the second via structure 962 of FIG. 9.

The memory 1232 (e.g., a computer-readable storage device) includes instructions 1268 (e.g., executable instructions), such as computer-readable instructions or processor-readable instructions. The instructions 1268 may include one or more instructions that are executable by a computer, such as the processor 1210.

FIG. 12 also shows a display controller 1226 that is coupled to the processor 1210 and to a display 1228. A coder/decoder (CODEC) 1234 can also be coupled to the processor 1210. A speaker 1236 and a microphone 1238 can be coupled to the CODEC 1234.

FIG. 12 also indicates that a wireless interface 1240 can be coupled to the processor 1210 and to an antenna 1242. In some implementations, the semiconductor device 100, the processor 1210, the display controller 1226, the memory 1232, the CODEC 1234, and the wireless interface 1240 are included in a system-in-package or system-on-chip device 1222. In some implementations, an input device 1230 and a power supply 1244 are coupled to the system-on-chip device 1222. Moreover, in a particular implementation, as illustrated in FIG. 12, the display 1228, the input device 1230, the speaker 1236, the microphone 1238, the antenna 1242, and the power supply 1244 are external to the system-on-chip device 1222. However, each of the display 1228, the input device 1230, the speaker 1236, the microphone 1238, the antenna 1242, and the power supply 1244 can be coupled to a component of the system-on-chip device 1222, such as an interface or a controller. Although the semiconductor device 100 is depicted as being included in the processor 1210, in other implementations, the semiconductor device 100 may be included in another component of the device 1200 or a component coupled to the device 1200. For example, the semiconductor device 100 may be included in the memory 1232, the wireless interface 1240 (e.g., wireless controller), the power supply 1244, the input device 1230, the display 1228, the display controller 1226, the CODEC 1234, the speaker 1236, or the microphone 1238. To illustrate, one or more of the components of the electronic device 1200 may include a semiconductor device (e.g., the semiconductor device 100) that is constructed in such a way that components of the semiconductor device may be electrically connected to one or more self-aligned structures (e.g., corresponding to the first via structure 160, the second via structure 162, the fourth via structure 174 of FIG. 1).

In conjunction with one or more of the described aspects of FIGS. 1-12, an apparatus is disclosed that may include a substrate and a fin-type semiconductor device extending from the substrate. The fin-type semiconductor device may include first means for insulating a gate structure from a source/drain structure. The first means for insulating may be coupled to the gate structure and may be associated with a first etch selectivity. The first means for insulating may correspond to the gate hardmask structures 120-128 of FIG. 1A, the gate hardmask structures 205, 206 depicted in FIGS. 2A-2F, the gate hardmask structures 306-309 depicted in FIGS. 3A-3J, the hardmask structures 770, 774, 780, 784 of FIG. 7, the hardmask structures 801, 804, 805 depicted in FIGS. 8A-F, one or more other structures configured to insulate, or any combination thereof. The first means for insulating may also insulate the gate structure, the source/drain structure, or combination thereof, from via structures.

The fin-type semiconductor device may also include second means for insulating the gate structure from the source/drain structure. The second means for insulating may be coupled to the source/drain structure and may be associated with a second etch selectivity that is different from the first etch selectivity. The second means for insulating may correspond to the source/drain hardmask structures 140-146 of FIG. 1A, the source/drain hardmask structure 241 depicted in FIGS. 2B, the source/drain hardmask structures 341-343 depicted in FIGS. 3D-3J, the hardmask structures 772, 776, 782, 786 of FIG. 7, the hardmask structures 802, 803 in FIGS. 8A-F, one or more other structures configured to insulate, or any combination thereof. The second means for insulating may also insulate the gate structure, the source/drain structure, or combination thereof, from via structures.

In some implementations, the fin-type semiconductor device may also include third means for insulating the gate structure from the source drain structure. The third means for insulating may be positioned between the first means for insulating and the second means for insulating. The third means for insulating may be positioned between the gate structure and the source/drain structure. The third means for insulating may be associated with a third etch selectivity that is different from the first etch selectivity and the second etch selectivity. The third means for insulating may correspond to the spacer structures 150-159 of FIG. 1A, the spacer structures 361-368 as depicted in FIGS. 3G-J, the spacer structures 750-753 of FIG. 7, one or more other structures configured to insulate, or any combination thereof. The third means for insulating may also insulate the gate structure, the source/drain structure, or combination thereof, from via structures.

One or more of the disclosed aspects may be implemented in a system or an apparatus, such as the electronic device 1200, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the electronic device 1200 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Figure 13:
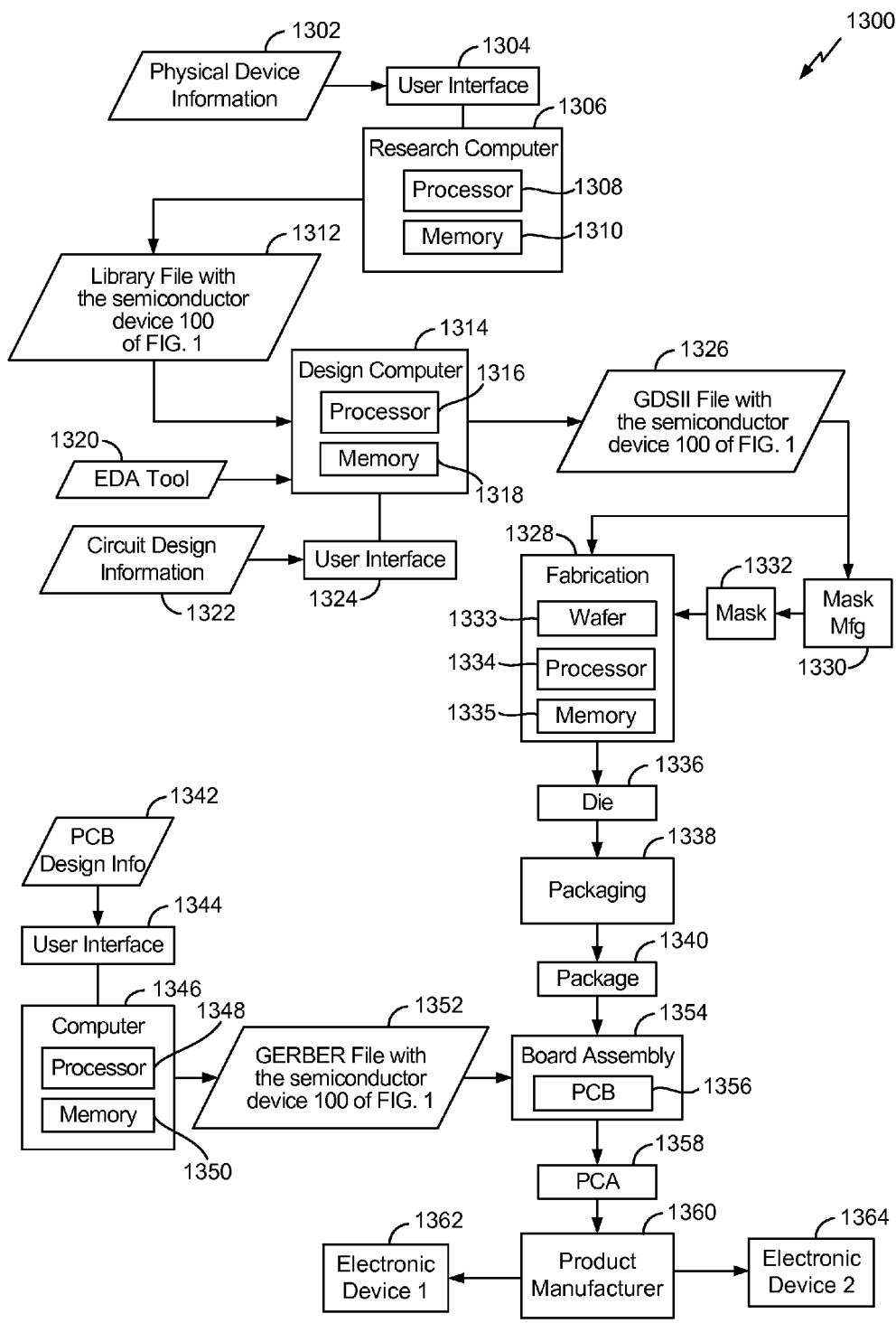
FIG. 13 is a data flow diagram of a particular illustrative manufacturing process to manufacture electronic devices that include a self-aligned structure.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 13 depicts a particular illustrative example of an electronic device manufacturing process 1300.

Physical device information 1302 is received at the manufacturing process 1300, such as at a research computer 1306. The physical device information 1302 may include design information representing at least one physical property of the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer-readable storage device (e.g., a non-transitory computer-readable medium), such as a memory 1310. The memory 1310 may store computer-readable instructions that are executable to cause the processor 1308 to transform the physical device information 1302 to comply with a file format and to generate a library file 1312.

In some implementations, the library file 1312 includes at least one data file including the transformed design information. For example, the library file 1312 may include a library of devices including a device that includes the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof, that is provided for use with an electronic design automation (EDA) tool 1320.

The library file 1312 may be used in conjunction with the EDA tool 1320 at a design computer 1314 including a processor 1316, such as one or more processing cores, coupled to a memory 1318. The EDA tool 1320 may be stored as processor executable instructions at the memory 1318 to enable a user of the design computer 1314 to design a circuit including the semiconductor device 100 (e.g., a self-aligned structure, such as the first via structure 160, the second via structure 162, or the fourth via structure 174) of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 (e.g., a self-aligned structure, such as the first via structure 760 or the second via structure 762) of FIG. 7, a semiconductor device formed according to the process shown in FIGS. 8A-I, the semiconductor device 900 (e.g., a self-aligned structure, such as , the first via structure 960 or the second via structure 962) of FIG. 9, a semiconductor device formed according to the method 1000 of FIG. 10, a semiconductor device formed according to the method 1100 of FIG. 11, or a combination thereof. For example, a user of the design computer 1314 may enter circuit design information 1322 via a user interface 1324 coupled to the design computer 1314. The circuit design information 1322 may include design information representing at least one physical property of a component (e.g., a self-aligned structure) of the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof. To illustrate, the circuit design property may include identification of particular circuits and relationships to other elements in a circuit design, positioning information, feature size information, interconnection information, or other information representing a physical property of components (e.g., a self-aligned structure) of the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof.

The design computer 1314 may be configured to transform the design information, including the circuit design information 1322, to comply with a file format. To illustrate, the file format may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1326 that includes information describing the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof, in addition to other circuits or information. To illustrate, the data file may include information corresponding to a system-on-chip (SOC) that includes the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof, and that also includes additional electronic circuits and components within the SOC.

The GDSII file 1326 may be received at a fabrication process 1328 to manufacture the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof, according to transformed information in the GDSII file 1326. For example, a device manufacture process may include providing the GDSII file 1326 to a mask manufacturer 1330 to create one or more masks, such as masks to be used with photolithography processing, illustrated as a representative mask 1332. The mask 1332 may be used during the fabrication process to generate one or more wafers 1333, which may be tested and separated into dies, such as a representative die 1336. The die 1336 includes a circuit including a device that includes the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof.

For example, the fabrication process 1328 may include a processor 1334 and a memory 1335 to initiate, control, or a combination thereof, the fabrication process 1328. The memory 1335 may include executable instructions such as computer-readable instructions or processor-readable instructions. The executable instructions may include one or more instructions that are executable by a computer such as the processor 1334.

The fabrication process 1328 may be implemented by a fabrication system that is fully automated or partially automated. For example, the fabrication process 1328 may be automated according to a schedule. The fabrication system may include fabrication equipment (e.g., processing tools) to perform one or more operations to form a semiconductor device, such as the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof. For example, the fabrication equipment may be configured to deposit one or more materials, etch one or more materials, etch one or more dielectric materials, etch one or more etch stop layers, perform a chemical mechanical planarization (CMP) process, deposit a composite barrier material, perform a thermal anneal, deposit a conductive material, perform a chemical vapor deposition (CVD) process, perform an atomic layer deposition (ALD) process, etc., or a combination thereof, as illustrative, non-limiting examples.

The fabrication system (e.g., an automated system that performs the fabrication process 1328) may have a distributed architecture (e.g., a hierarchy). For example, the fabrication system may include one or more processors (e.g., the processor 1334), one or more memories (e.g., the memory 1335), one or more controllers, or a combination thereof, that are distributed according to the distributed architecture. The distributed architecture may include a high-level processor that controls or initiates operations of one or more low-level systems. For example, a high-level portion of the fabrication process 1328 may include one or more processors, such as the processor 1334, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 1334.

Alternatively, the processor 1334 may be a part of a high-level system, subsystem, or component of the fabrication system. In another implementation, the processor 1334 includes distributed processing at various levels and components of a fabrication system.

Thus, the processor 1334 may include processor-executable instructions that, when executed by the processor 1334, cause the processor 1334 to initiate or control formation of a self-aligned structure. For example, the executable instructions included in the memory 1335 may enable the processor 1334 to initiate formation of the semiconductor device 100 (e.g., a self-aligned structure, such as the first via structure 160, the second via structure 162, or the fourth via structure 174) of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 (e.g., a self-aligned structure, such as the first via structure 760 or the second via structure 762) of FIG. 7, a semiconductor device formed according to the process shown in FIGS. 8A-I, the semiconductor device 900 (e.g., a self-aligned structure, such as , the first via structure 960 or the second via structure 962) of FIG. 9, a semiconductor device formed according to the method 1000 of FIG. 10, a semiconductor device formed according to the method 1100 of FIG. 11, or a combination thereof. In some implementations, the memory 1335 is a non-transient computer-readable medium storing computer-executable instructions that are executable by the processor 1334 to cause the processor 1334 to initiate formation of a semiconductor device in accordance with at least a portion of the process shown in FIGS. 2A-H, at least a portion of the process shown in FIGS. 3A-J, at least a portion of the process shown in FIGS. 5A-C, at least a portion of the process shown in FIGS. 6A-B, at least a portion of the process shown in FIGS. 8A-I, at least a portion of the method 1000 of FIG. 10, at least a portion of the method 1100 of FIG. 11, or any combination thereof. For example, the computer executable instructions may be executable to cause the processor 1334 to initiate or control formation of the semiconductor device 100 of FIG. 1A.

As an illustrative example, the processor 1334 may initiate or control forming a gate hardmask structure of a fin-type semiconductor device. The gate hardmask structure includes a first material having a first etch selectivity. The processor 1334 may further initiate or control forming a source/drain hardmask structure of the fin-type semiconductor device. The source/drain hardmask structure includes a second material having a second etch selectivity. The second etch selectivity may be different from the first etch selectivity.

The die 1336 may be provided to a packaging process 1338 where the die 1336 is incorporated into a representative package 1340. For example, the package 1340 may include the single die 1336 or multiple dies, such as a system-in-package (SiP) arrangement. For example, the package 1340 may include or correspond to the system in package or system-on-chip device 1222 of FIG. 12. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1350. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device including the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof.

The computer 1346 may be configured to transform the PCB design information 1342 to generate a data file, such as a GERBER file 1352 with data that includes physical positioning information of a packaged semiconductor device on a circuit board, as well as layout of electrical connections such as traces (e.g., metal lines) and vias (e.g., via structures), where the packaged semiconductor device corresponds to the package 1340 including the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof. In other implementations, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines to perform various steps of a PCB production process. The PCB 1356 may be populated with electronic components including the package 1340 to form a representative printed circuit assembly (PCA) 1358.

The PCA 1358 may be received at a product manufacture process 1360 and integrated into one or more electronic devices, such as a first representative electronic device 1362 and a second representative electronic device 1364. For example, the first representative electronic device 1362, the second representative electronic device 1364, or both, may include or correspond to the device 1200 of FIG. 12. As an illustrative, non-limiting example, the first representative electronic device 1362, the second representative electronic device 1364, or both, may include a communications device, a fixed location data unit, a mobile location data unit, a mobile phone, a cellular phone, a satellite phone, a computer, a tablet, a portable computer, or a desktop computer, into which the semiconductor device 100 (e.g., a self-aligned structure, such as the first via structure 160, the second via structure 162, or the fourth via structure 174) of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 (e.g., a self-aligned structure, such as the first via structure 760 or the second via structure 762) of FIG. 7, a semiconductor device formed according to the process shown in FIGS. 8A-I, the semiconductor device 900 (e.g., a self-aligned structure, such as , the first via structure 960 or the second via structure 962) of FIG. 9, a semiconductor device formed according to the method 1000 of FIG. 10, a semiconductor device formed according to the method 1100 of FIG. 11, or a combination thereof, is integrated. Alternatively or additionally, the first representative electronic device 1362, the second representative electronic device 1364, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the semiconductor device 100 (e.g., a self-aligned structure, such as the first via structure 160, the second via structure 162, or the fourth via structure 174) of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 (e.g., a self-aligned structure, such as the first via structure 760 or the second via structure 762) of FIG. 7, a semiconductor device formed according to the process shown in FIGS. 8A-I, the semiconductor device 900 (e.g., a self-aligned structure, such as , the first via structure 960 or the second via structure 962) of FIG. 9, a semiconductor device formed according to the method 1000 of FIG. 10, a semiconductor device formed according to the method 1100 of FIG. 11, or a combination thereof, is integrated. As another illustrative, non-limiting example, one or more of the electronic devices 1362 and 1364 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 13 illustrates remote units according to teachings of the disclosure, the disclosure is not limited to these illustrated units. Aspects of the disclosure may be suitably employed in any device which includes active integrated circuitry including memory and on-chip circuitry.

A device that includes the semiconductor device 100 of FIG. 1A, a semiconductor device formed according to the process shown in FIGS. 2A-H, a semiconductor device formed according to the process shown in FIGS. 3A-J, the semiconductor device 400 of FIG. 4, a semiconductor device formed according to the process shown in FIGS. 5A-C, a semiconductor device formed according to the process shown in FIGS. 6A-B, the semiconductor device 700 of FIG. 7, a semiconductor device formed according to the process shown in FIGS. 8A-I, the semiconductor device 900 of FIG. 9, a semiconductor device formed according to the method 1000 of FIG. 10, a semiconductor device formed according to the method 1100 of FIG. 11, or a combination thereof, may be fabricated, processed, and incorporated into an electronic device, as described in the illustrative process 1300. One or more aspects disclosed with respect to FIGS. 1-13 may be included at various processing stages, such as within the library file 1312, the GDSII file 1326 (e.g., a file having a GDSII format), and the GERBER file 1352 (e.g., a file having a GERBER format), as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical example, such as the mask 1332, the die 1336, the package 1340, the PCA 1358, other products such as prototype circuits or devices (not shown), or any combination thereof Although various representative stages of production from a physical device design to a final product are depicted, in other implementation fewer stages may be used or additional stages may be included. Similarly, the process 1300 may be performed by a single entity or by one or more entities performing various stages of the process 1300.

Although one or more of FIGS. 1-13 may illustrate systems, apparatuses, methods, or a combination thereof, according to the teachings of the disclosure, the disclosure is not limited to these illustrated systems, apparatuses, methods, or a combination thereof. One or more functions or components of any of FIGS. 1-13 as illustrated or described herein may be combined with one or more other portions of another of FIGS. 1-13. Accordingly, no single aspect described herein should be construed as limiting and aspects of the disclosure may be suitably combined without departing from the teachings of the disclosure.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be included directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal.

The previous description is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A fin-type semiconductor device comprising:
a gate structure;
a source/drain structure,
a gate hardmask structure coupled to and corresponding to the gate structure, the gate hardmask structure comprising a first material;
a source/drain hardmask structure coupled to and corresponding to the source/drain structure, the source/drain hardmask structure comprising a second material; and
a spacer structure positioned between the gate structure and the source/drain structure and positioned between the gate hardmask structure and the source/drain hardmask structure, wherein sidewalls of the gate structure, sidewalls of the source/drain structure, and the spacer structure define a gap, wherein the gap is positioned between the gate structure and the source/drain structure, and wherein the gap comprises an air gap.

2. The fin-type semiconductor device of claim 1, wherein the first material has a different etch selectivity from the second material with respect to a particular type of etching process, wherein the gate hardmask structure is in contact with the gate structure, and wherein the source/drain hardmask structure is in contact with the source/drain structure.

3. The fin-type semiconductor device of claim 2, wherein the spacer structure comprises a third material, and wherein the third material has a third etch selectivity with respect to the particular type of etching process.

4. The fin-type semiconductor device of claim 3, wherein the third etch selectivity is different from the etch selectivity of the first material, the second material, or both.

5. The fin-type semiconductor device of claim 1, wherein the first material comprises oxygen doped silicon carbide, and wherein the second material comprises silicon nitride.

6. The fin-type semiconductor device of claim 1, wherein the spacer structure comprises a third material, wherein the third material has a different etch selectivity from the first material, the second material, or both, with respect to a particular type of etching process, and wherein the gap is defined by the spacer structure, the gate structure, and the source/drain structure.

7. The fin-type semiconductor device of claim 6, further comprising one or more sidewall spacer structures coupled to the gate structure, wherein a particular sidewall spacer structure of the one or more sidewall spacer structures is further coupled to the spacer structure.

8. The fin-type semiconductor device of claim 6, wherein the third material comprises silicon dioxide.

9. The fin-type semiconductor device of claim 1, further comprising a gate via structure coupled to the gate structure, the gate via structure in contact with the gate hardmask structure.

10. The fin-type semiconductor device of claim 9, wherein the gate via structure is further in contact with the source/drain hardmask structure, and wherein the gate via structure comprises a gate contact.

11. The fin-type semiconductor device of claim 1, further comprising a source/drain via structure coupled to the source/drain structure, the source/drain via structure in contact with the source/drain hardmask structure.

12. The fin-type semiconductor device of claim 11, wherein the source/drain via structure is further in contact with the gate hardmask structure, and wherein the source/drain via structure comprises a source/drain contact.

13. The fin-type semiconductor device of claim 1, further comprising:
a second gate hardmask structure coupled to the gate structure, the second gate hardmask structure positioned between the gate hardmask structure and the gate structure; and
a second source/drain hardmask structure coupled to the source/drain structure, the second source/drain hardmask structure positioned between the source/drain hardmask structure and the source/drain structure.

14. The fin-type semiconductor device of claim 13, wherein the second gate hardmask structure comprises the second material, wherein the second source/drain hardmask structure comprises the first material, and wherein a first thickness of the gate hardmask structure is greater than a second thickness of the second gate hardmask structure.

15. The fin-type semiconductor device of claim 14, further comprising:
a first sidewall spacer structure coupled to the gate structure and to the spacer structure;
a second sidewall spacer structure coupled to the gate structure, the gate hardmask structure, the second gate hardmask structure, and a dielectric layer; and
a third sidewall spacer structure coupled to the spacer structure and the dielectric layer.

16. The fin-type semiconductor device of claim 1, further comprising a fin shaped channel region, wherein the gate structure is positioned between the gate hardmask structure and the fin shaped channel region, and wherein the fin shaped channel region is associated with a fin of a fin field-effect transistor (FinFET).

17. The fin-type semiconductor device of claim 16, further comprising:
a substrate, wherein the fin shaped channel region protrudes from the substrate and is positioned between the gate structure and the substrate; and
a source/drain region, wherein the source/drain region is positioned between the source/drain structure and the substrate.

18. The fin-type semiconductor device of claim 1, further comprising a dielectric layer, wherein the gate hardmask structure is positioned between the dielectric layer and the gate structure, and wherein the source/drain hardmask structure is positioned between the dielectric layer and the source/drain structure.

19. A method of forming a fin-type semiconductor device, the method comprising:
forming a gate hardmask structure, the gate hardmask structure coupled to a gate structure and comprising a first material having a first etch selectivity with respect to a particular type of etching process; and
forming a source/drain hardmask structure, the source/drain hardmask structure coupled to a source/drain structure and comprising a second material having a second etch selectivity with respect to the particular type of etching process, the second etch selectivity different from the first etch selectivity; and
forming a spacer structure between the gate structure and the source/drain structure and between the gate hardmask structure and the source/drain hardmask structure, the spacer structure comprising a third material, wherein sidewalls of the gate structure, sidewalls of the source/drain structure, and the spacer structure define a gap, wherein the gap is positioned between the gate structure and the source/drain structure, and wherein the gap comprises an air gap.

20. The method of claim 19, further comprising:
performing a first etching process to remove a portion of the gate hardmask structure and to expose a portion of the gate structure; and
forming a self-aligned gate via structure that is in contact with the gate structure.

21. The method of claim 20, further comprising:
performing a second etching process to remove a portion of the source/drain hardmask structure and to expose a portion of the source/drain structure; and
forming a self-aligned source/drain via structure that is in contact with the source/drain structure.

22. The method of claim 19, wherein the third material has a third etch selectivity with respect to the particular type of etching process.

23. The method of claim 22, further comprising:
forming a first etch mask;
performing a first etching process to remove a portion of the gate hardmask structure and to expose a portion of the gate structure; and
removing the first etch mask.

24. The method of claim 23, further comprising forming a gate via structure, the gate via structure coupled to the gate structure, and wherein forming the spacer structure comprises conformally depositing the third material to form the spacer structure such that the spacer structure, the gate structure, and the source/drain structure define the gap.

25. The method of claim 23, further comprising:
forming a second etch mask;
performing a second etching process to remove a portion of the source/drain hardmask structure and to expose a portion of the source/drain structure; and
removing the second etch mask.

26. The method of claim 25, wherein the first etching process exposes a first portion of the spacer structure, wherein the second etching process further exposes a second portion of the spacer structure, and further comprising:
forming one or more sidewall spacer structures coupled to the gate structure; and
forming a gate via structure, the gate via structure coupled to the gate structure.

27. A fin-type semiconductor device fabricated according to the method of claim 19.

28. The method of claim 19, further comprising:
forming a second gate hardmask structure prior to forming the gate hardmask structure, the second gate hardmask structure comprising the second material, the second gate hardmask structure positioned between the gate structure and the gate hardmask structure; and
forming a second source/drain hardmask structure prior to forming the source/drain hardmask structure, the second source/drain hardmask structure comprising the first material, the second source/drain hardmask structure positioned between the source/drain structure and the source/drain hardmask structure.

29. The method of claim 28, further comprising:
performing a first etching process, the first etching process comprising:
etching the gate hardmask structure to expose a portion of the second gate hardmask structure; and
etching the second gate hardmask structure to expose a portion of the gate structure; and
forming a gate via structure, the gate via structure in contact with the gate structure.

30. The method of claim 29, further comprising:
performing a second etching process, the second etching process comprising:
etching the source/drain hardmask structure to expose a portion of the source/drain hardmask structure; and
etching the second source/drain hardmask structure to expose a portion of the source/drain structure; and
forming a source/drain via structure, the source/drain via structure in contact with the source/drain structure.

31. The method of claim 19, wherein forming the gate hardmask structure and forming the source/drain hardmask structure are initiated at or controlled by a controller of a fabrication system.

32. A computer-readable storage device that stores instructions that, when executed by a processor, cause the processor to perform operations comprising:
initiating formation of a gate hardmask structure of a fin-type semiconductor device, the gate hardmask structure coupled to a gate structure and comprising a first material having a first etch selectivity with respect to a particular type of etching process; and
initiating formation of a source/drain hardmask structure of the fin-type semiconductor device, the source/drain hardmask structure coupled to a source drain structure and comprising a second material having a second etch selectivity with respect to the particular type of etching process, the second etch selectivity different from the first etch selectivity; and
initiating formation of a spacer structure between the gate structure and the source/drain structure and between the gate hardmask structure and the source/drain hardmask structure, the spacer structure comprising a third material, wherein sidewalls of the gate structure, sidewalls of the source/drain structure, and the spacer structure define a gap, wherein the gap is positioned between the gate structure and the source/drain structure, and wherein the gap comprises an air gap.

33. The computer-readable storage device of claim 32, wherein the third material has a third etch selectivity with respect to the particular type of etching process, wherein the third etch selectivity is different from the first etch selectivity, the second etch selectivity, or both.

34. The computer-readable storage device of claim 32, wherein the operations further comprise:
initiating formation of the gate structure prior to initiating formation of the gate hardmask structure;
initiating formation of the source/drain structure prior to initiating formation of the source/drain hardmask structure;
initiating a first etching process to remove a portion of the gate hardmask structure and to expose a portion of the gate structure; and
initiating a second etching process to remove a portion of the source/drain hardmask structure and to expose a portion of the source/drain structure.

35. The computer-readable storage device of claim 34, wherein the operations further comprise:
initiating formation of one or more sidewall spacer structures, the one or more sidewall spacer structures coupled the gate structure;
initiating formation of a gate via structure, the gate via structure coupled to the gate structure; and
initiating formation of a source/drain via structure, the source/drain via structure coupled to the source/drain structure.

36. An apparatus comprising:
first means for insulating a gate structure from a source/drain structure, the first means for insulating coupled to the gate structure of a fin-type semiconductor device, the first means for insulating associated with a first etch selectivity with respect to a particular type of etching process;
second means for insulating the gate structure from the source/drain structure, the second means for insulating coupled to the source/drain structure of the fin-type semiconductor device, the second means for insulating associated with a second etch selectivity with respect to the particular type of etching process, the second etch selectivity different from the first etch selectivity; and
third means for insulating the gate structure from the source/drain structure, the third means for insulating positioned between the first means for insulating and the second means for insulating, wherein sidewalls of the gate structure, sidewalls of the source/drain structure, and the third means for insulating define a gap, wherein the gap is positioned between the gate structure and the source/drain structure, and wherein the gap comprises an air gap.

37. The apparatus of claim 36, wherein the first means for insulating comprises a gate hardmask structure, and wherein the second means for insulating comprises a source/drain hardmask structure.

38. The apparatus of claim 36, wherein the third means for insulating comprises a spacer structure.

39. The apparatus of claim 36, wherein the third means for insulating is associated with a third etch selectivity with respect to the particular type of etching process.

40. The apparatus of claim 39, wherein the third etch selectivity is different from the first etch selectivity, the second etch selectivity, or both.

* * * * *